(12) United States Patent
Tak et al.

(10) Patent No.: US 12,446,431 B2
(45) Date of Patent: Oct. 14, 2025

(54) COLOR CONVERSION PANEL AND DISPLAY DEVICE INCLUDING SAME

(71) Applicant: Samsung Display Co., LTD., Yongin-si (KR)

(72) Inventors: Kyung Seon Tak, Hwaseong-si (KR); Gi Hoon Yang, Hwaseong-si (KR); Young Gu Kim, Yongin-si (KR); Yun-Hee Park, Hwaseong-si (KR); Bong-Sung Seo, Suwon-si (KR); Seung Hee Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 434 days.

(21) Appl. No.: 18/083,736

(22) Filed: Dec. 19, 2022

(65) Prior Publication Data

US 2023/0301153 A1 Sep. 21, 2023

(30) Foreign Application Priority Data

Mar. 17, 2022 (KR) ........................ 10-2022-0033555

(51) Int. Cl.
*H10K 59/38* (2023.01)
*H10H 20/821* (2025.01)
(Continued)

(52) U.S. Cl.
CPC ........... *H10K 59/38* (2023.02); *H10H 20/821* (2025.01); *H10H 20/851* (2025.01);
(Continued)

(58) Field of Classification Search
None
See application file for complete search history.

(56) References Cited

U.S. PATENT DOCUMENTS 10,241,360 B2 3/2019 Chu et al.
10,558,074 B2 2/2020 Chu et al.
(Continued)

FOREIGN PATENT DOCUMENTS

KR 1020170124122 11/2017
KR 1020180018969 2/2018
(Continued)

OTHER PUBLICATIONS

PCT Search Report—PCT Patent Application No. PCT/KR2023/003588 dated Jul. 14, 2023.

*Primary Examiner* — Bilkis Jahan
(74) *Attorney, Agent, or Firm* — CANTOR COLBURN LLP

(57) ABSTRACT

A color conversion panel includes: a substrate; a plurality of banks disposed on the substrate, where the banks partition a first light emitting region, a second light emitting region, and a third light emitting region; a first color conversion layer disposed in the first light emitting region, a second color conversion layer disposed in the second light emitting region, and a transmission layer disposed in the third light emitting region; and a first reflective layer disposed to overlap the first color conversion layer and the second color conversion layer, where the first reflective layer includes a first layer, a second layer, and a third layer, a refractive index of the second layer is greater than a refractive index of the third layer, and the refractive index of the third layer is greater than a refractive index of the first layer.

16 Claims, 23 Drawing Sheets

(51) Int. Cl.
   *H10H 20/851* (2025.01)
   *H10H 20/856* (2025.01)
   *H10H 29/14* (2025.01)
   *H10K 50/856* (2023.01)
   *H10K 59/12* (2023.01)

(52) U.S. Cl.
   CPC ........ *H10H 20/856* (2025.01); *H10H 29/142* (2025.01); *H10K 50/856* (2023.02); *H10K 59/12* (2023.02)

(56) References Cited

U.S. PATENT DOCUMENTS

| | | |
|---|---|---|
| 10,985,218 B2 | 4/2021 | Park et al. |
| 11,480,824 B2 | 10/2022 | Chu et al. |
| 12,057,531 B2 * | 8/2024 | Aoyama ............. H10H 29/142 |
| 2016/0041429 A1 * | 2/2016 | Wang ................ G02F 1/133555 |
| | | 349/61 |
| 2016/0190212 A1 * | 6/2016 | Takii ...................... H10K 59/38 |
| | | 257/40 |
| 2019/0140017 A1 * | 5/2019 | Chen ..................... H10H 29/142 |
| 2020/0357853 A1 | 11/2020 | Yan et al. |
| 2021/0183827 A1 * | 6/2021 | Maegawa ............ H10H 20/856 |
| 2022/0020965 A1 | 1/2022 | Park et al. |
| 2022/0190274 A1 * | 6/2022 | Kim .................. H10K 59/8792 |
| 2022/0302229 A1 * | 9/2022 | Yue ........................ H10K 59/38 |
| 2023/0049324 A1 | 2/2023 | Chu et al. |

FOREIGN PATENT DOCUMENTS

| | | |
|---|---|---|
| KR | 101868171 | 6/2018 |
| KR | 1020200039219 | 4/2020 |
| KR | 1020200088923 | 7/2020 |
| KR | 1020210106613 | 8/2021 |
| KR | 1020220008995 | 1/2022 |

* cited by examiner

COLOR CONVERSION PANEL AND DISPLAY DEVICE INCLUDING SAME

This application claims priority to Korean Patent Application No. 10-2022-0033555, filed on Mar. 17, 2022, and all the benefits accruing therefrom under 35 U.S.C. § 119, the content of which in its entirety is herein incorporated by reference.

BACKGROUND

(a) Field

The disclosure relates to a color conversion panel and a display device including the color conversion panel.

(b) Description of the Related Art

In a light emitting element, an exciton is formed by combining a hole supplied from an anode and an electron supplied from a cathode in an emission layer formed between the anode and the cathode, and the exciton is stabilized and emits light.

Since such light emitting elements have various desired characteristics such as wide viewing angle, fast response speed, thin thickness, and low power consumption, the light emitting elements are widely applied to various electric and electronic devices such as a television, a monitor, and a mobile phone.

Recently, a display device including a color conversion panel has been proposed to implement a display device with high efficiency. The color conversion panel color-converts or transmits incident light into different colors.

SUMMARY

Embodiments are to provide a color conversion panel of which luminance is increased by reflecting light converted and emitted from a rear surface, and a display device including the color conversion panel.

A color conversion panel according to an embodiment includes: a substrate; a plurality of banks disposed on the substrate, where the banks partition a first light emitting region, a second light emitting region, and a third light emitting region; a first color conversion layer disposed in the first light emitting region, a second color conversion layer disposed in the second light emitting region, and a transmission layer disposed in the third light emitting region; and a first reflective layer disposed to overlap the first color conversion layer and the second color conversion layer, where the first reflective layer includes a first layer, a second layer, and a third layer, a refractive index of the second layer of the first reflective layer is greater than a refractive index of the third layer of the first reflective layer, and the refractive index of the third layer of the first reflective layer is greater than a refractive index of the first layer of the first reflective layer.

In an embodiment, the first layer of the first reflective layer may be closest to the substrate, the third layer of the first reflective layer may be furthest from the substrate, and the second layer of the first reflective layer may be between the first layer of the first reflective layer and the third layer of the first reflective layer.

In an embodiment, a thickness of the second layer of the first reflective layer may be less than a thickness of the first layer of the first reflective layer and a thickness of the third layer of the first reflective layer.

In an embodiment, a thickness of the first layer of the first reflective layer may be in a range of about 120 nm to about 140 nm, a thickness of the second layer of the first reflective layer may be in a range of about 90 nm to about 110 nm, and a thickness of the third layer of the first reflective layer may be in a range of about 120 nm to about 140 nm.

In an embodiment, the refractive index of the first layer of the first reflective layer may be in a range of about 1.35 to about 1.45.

In an embodiment, the refractive index of the second layer of the first reflective layer may be in a range of about 1.92 to about 2.02.

In an embodiment, the refractive index of the third layer of the first reflective layer may be in a range of about 1.55 to about 1.65.

In an embodiment, the first reflective layer may have a reflectance less than about 1% for light of a wavelength of about 450 nm, and a reflectance greater than about 6% for light of a wavelength in a range of about 550 nm to about 650 nm.

In an embodiment, the first reflective layer may be disposed to overlap the transmission layer.

In an embodiment, the color conversion panel may further include a second reflective layer disposed on the first reflective layer, where the second reflective layer may include a first layer, a second layer, and a third layer, a refractive index of the second layer of the second reflective layer may be greater than a refractive index of the third layer of the second reflective layer, and the refractive index of the third layer of the second reflective layer may be greater than a refractive index of the first layer of the second reflective layer.

In an embodiment, a thickness of the first layer of the second reflective layer may be in a range of about 120 nm to about 140 nm, a thickness of the second layer of the second reflective layer may be in a range of about 90 nm to about 110 nm, and a thickness of the third layer of the second reflective layer may be in a range of about 120 nm to about 140 nm.

In an embodiment, the refractive index of the first layer of the second reflective layer may be in a range of about 1.35 to about 1.45, the refractive index of the second layer of the second reflective layer may be in a range of about 1.92 to about 2.02, and the refractive index of the third layer of the second reflective layer may be in a range of about 1.55 to about 1.65.

In an embodiment, a stacked structure of the first reflective layer and the second reflective layer may have a reflectance less than about 2%, for light of a wavelength of about 450 nm and a reflectance greater than about 14% for light of a wavelength in a range of about 550 nm to about 650 nm.

In an embodiment, the first light emitting region may emit red light, the second light emitting region may emit green light, and the third light emitting region may emit blue light.

A display device according to an embodiment includes: a color conversion panel; and a display panel disposed to overlap the color conversion panel, where the display panel includes: a first substrate; and a light emitting element disposed on the first substrate, the color conversion panel includes: a second substrate; a plurality of banks disposed on the second substrate, where the banks partition a first light emitting region, a second light emitting region, and a third light emitting region; a first color conversion layer disposed in the first light emitting region, a second color conversion layer disposed in the second light emitting region, and a transmission layer disposed in the third light emitting region; and a first reflective layer disposed to overlap the first color conversion layer and the second color conversion layer. In such an embodiment, the first reflective layer includes a first layer, a second layer, and a third layer, a refractive index of the second layer of the first reflective layer is greater than a refractive index of the third layer of the first reflective layer, and the refractive index of the third layer of the first reflective layer is greater than a refractive index of the first layer of the first reflective layer.

In an embodiment, the third layer of the first reflective layer may be closest to the light emitting element, the first layer of the first reflective layer may be furthest from the light emitting element, and the second layer of the first reflective layer may be between the first layer of the first reflective layer and the third layer of the first reflective layer.

In an embodiment, a thickness of the first layer of the first reflective layer may be in a range of about 120 nm to about 140 nm, a thickness of the second layer of the first reflective layer may be in a range of about 90 nm to about 110 nm, and a thickness of the third layer of the first reflective layer may be in a range of about 120 nm to about 140 nm.

In an embodiment, the refractive index of the first layer of the first reflective layer may be in a range of about 1.35 to about 1.45, the refractive index of the second layer of the first reflective layer may be in a range of about 1.92 to about 2.02, and the refractive index of the third layer of the first reflective layer may be in a range of about 1.55 to about 1.65.

In an embodiment, the first reflective layer may have a reflectance less than about 1% for light of a wavelength of about 450 nm, and a reflectance greater than about 6% for light of a wavelength in a range of about 550 nm to about 650 nm.

In an embodiment, the first reflective layer may be disposed to overlap the transmission layer.

In an embodiment, the display device may further include a second reflective layer disposed between the first reflective layer and the light emitting element, the second reflective layer may include a first layer, a second layer, and a third layer, a refractive index of the second layer of the second reflective layer may be greater than a refractive index of the third layer of the second reflective layer, and the refractive index of the third layer of the second reflective layer may be greater than a refractive index of the first layer of the second reflective layer.

In an embodiment, the first light emitting region may emit red light, the second light emitting region may emit green light, and the third light emitting region may emit blue light.

In an embodiment, the light emitting element may include an organic emission layer or a nano rod emission layer.

A display device according to an embodiment includes: a first substrate; a plurality of partitioning walls disposed on the first substrate; a light emitting element disposed between the partitioning walls; a plurality of banks disposed to overlap the partitioning walls, where the banks partition a first light emitting region, a second light emitting region, and a third light emitting region; a first color conversion layer disposed in the first light emitting region, a second color conversion layer disposed in the second light emitting region, and a transmission layer disposed in the third light emitting region; and a first reflective layer disposed between the first color conversion layer and the first substrate and between the second color conversion layer and the first substrate, the first reflective layer includes a first layer, a second layer, and a third layer, and a refractive index of the second layer of the first reflective layer is greater than a refractive index of the third layer of the first reflective layer, and the refractive index of the third layer of the first reflective layer is greater than a refractive index of the first layer of the first reflective layer.

In an embodiment, the third layer of the first reflective layer may be closest to the light emitting element, the first layer of the first reflective layer may be furthest from the light emitting element, and the second layer of the first reflective layer may be between the first layer of the first reflective layer and the third layer of the first reflective layer.

In an embodiment, a thickness of the first layer of the first reflective layer may be in a range of about 120 nm to about 140 nm, a thickness of the second layer of the first reflective layer may be in a range of about 90 nm to about 110 nm, and a thickness of the third layer of the first reflective layer may be in a range of about 120 nm to about 140 nm.

In an embodiment, the refractive index of the first layer of the first reflective layer may be in a range of about 1.35 to about 1.45, the refractive index of the second layer of the first reflective layer may be in a range of about 1.92 to about 2.02, and the refractive index of the third layer of the first reflective layer may be in a range of about 1.55 to about 1.65.

In an embodiment, the first reflective layer may have a reflectance less than about 1% for light of a wavelength of about 450 nm, and a reflectance greater than about 6% for light of a wavelength in a range of about 550 nm to about 650 nm.

In an embodiment, the first reflective layer may be disposed between the transmission layer and the first substrate.

In an embodiment, the display device may further include a second reflective layer disposed between the first reflective layer and the light emitting element, where the second reflective layer may include a first layer, a second layer, and a third layer, a refractive index of the second layer of the second reflective layer may be greater than a refractive index of the third layer, of the second reflective layer and the refractive index of the third layer of the second reflective layer may be greater than a refractive index of the first layer of the second reflective layer.

In an embodiment, the first light emitting region may emit red light, the second light emitting region may emit green light, and the third light emitting region may emit blue light.

In an embodiment, the light emitting element may include an organic layer or a nano rod.

According to embodiments, a color conversion panel of a display device that increases luminance by reflecting light that is converted and emitted to the rear surface, and a display device including the color conversion panel may be provided.

DETAILED DESCRIPTION

Figure 1:
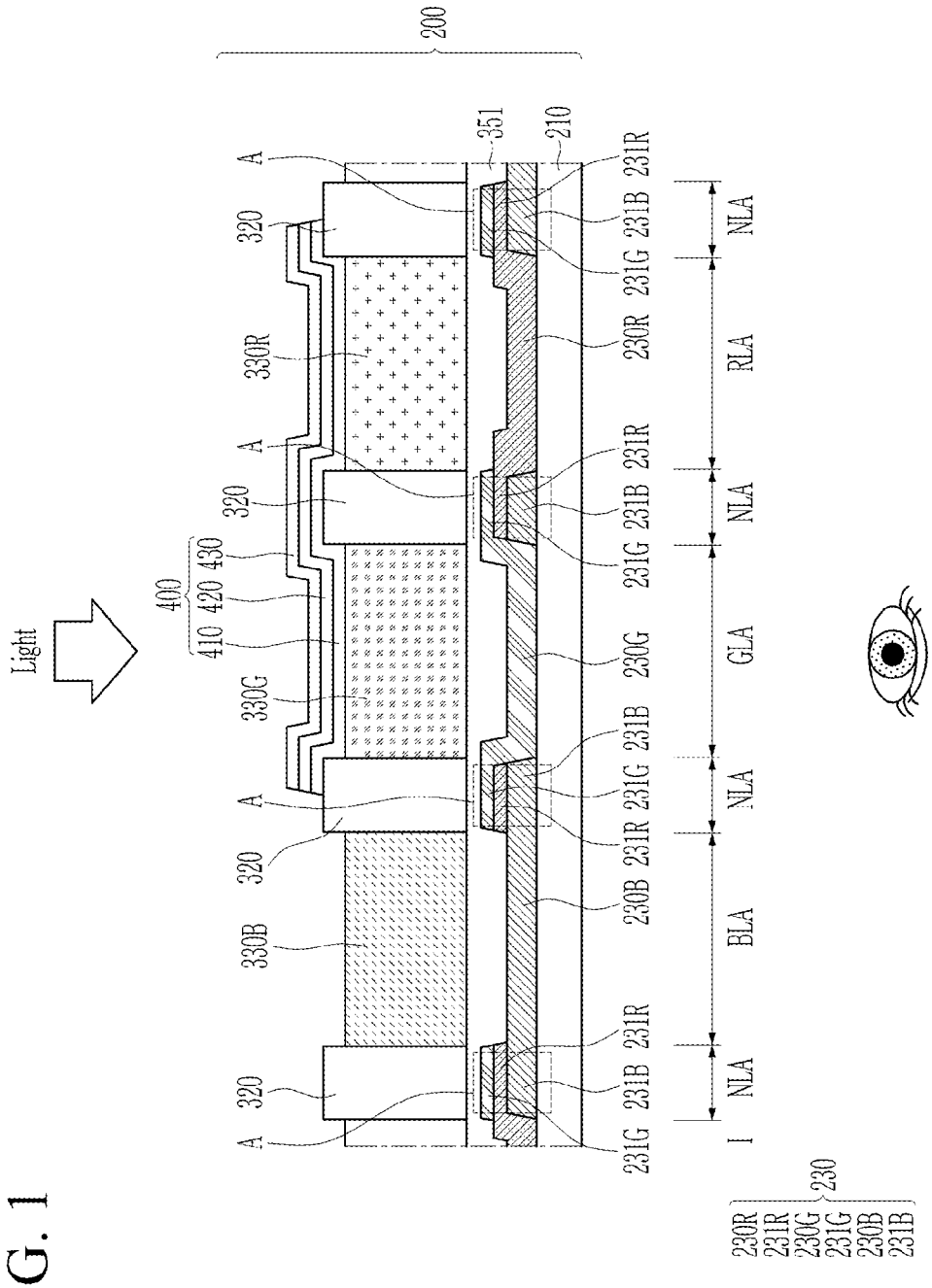
FIG. 1 illustrates a color conversion panel according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

The drawings and description are to be regarded as illustrative in nature and not restrictive. Like reference numerals designate like elements throughout the specification.

In addition, since the size and thickness of each configuration shown in the drawings are arbitrarily indicated for better understanding and ease of description, the present invention is not necessarily limited to the drawings. In the drawings, the thickness of layers, films, panels, regions, etc., are exaggerated for clarity. In addition, in the drawing, the thickness of some layers and regions is exaggerated for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to mean positioned above or below the target element, and will not necessarily be understood to mean positioned "at an upper side" based on an opposite to gravity direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Further, throughout the specification, the phrase "on a plane" means viewing a target portion from the top, and the phrase "on a cross-section" means viewing a cross-section formed by vertically cutting a target portion from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 illustrates a color conversion panel 200 according to an embodiment. Referring to FIG. 1, a color conversion panel 200 according to an embodiment includes a second substrate 210, color filters 230 positioned (or disposed) on the second substrate 210, banks 320 positioned between the color filters 230, and a red color conversion layer 330R, a green color conversion layer 330G and a transmission layer 330B, which are positioned between the banks 320. In such an embodiment, a reflective layer 400 positioned on the red color conversion layer 330R and the green color conversion layer 330G is included. The reflective layer 400 may have a stacked structure of layers having different refractive indices from each other, that is, be defined by a stacked structure in which layers having different refractive indices from each other are stacked one on another. In such an embodiment, the reflective layer 400 may transmit blue light and reflect green light and red light. The reflective layer 400 may include a first layer 410, a second layer 420, and a third layer 430. In such an embodiment, refractive indices of the first layer 410, the second layer 420, and the third layer 430 may be different from each other By having a stacked structure of the first layer 410, the second layer 420, and the third layer 430 having different refractive indices from each other, the reflective layer 400 transmits blue light and reflects green light and red light to increase light output efficiency. The stack structure and effect of the reflective layer 400 will be described later in greater detail.

The color conversion panel of FIG. 1 may overlap a display panel (not shown). The color conversion panel and the display panel may be combined with each other to form a display device.

The color conversion panel 200 of FIG. 1 emits light emitted from a light emitting element (not shown) through color conversion or transmission. In FIG. 1, a direction in which light Light emitted from the light emitting element is indicated by an arrow, and a direction in which a user perceives the color conversion panel 200 and a display device including the color conversion panel 200 is indicated by an eye shape.

As shown in FIG. 1, the light emitted from the display panel may pass through the color conversion layers 330R and 330G or the transmission layer 330B of the color conversion panel, and then pass through the color filter 230 and the second substrate 210 to be emitted. As shown in FIG. 1, the reflective layer 400 may be positioned between the color conversion layers 330R and 330G and the light emitting element (not shown).

Hereinafter, a configuration of an embodiment of the color conversion panel 200 will be described in detail with reference to FIG. 1. In an embodiment of the color conversion panel 200, the color filters 230 including a blue color filter 230B, a red color filter 230R, and a green color filter 230G are positioned on the second substrate 210.

Referring to FIG. 1, a blue dummy color filter 231B is positioned in or directly on a same layer as the blue color filter 230B. The blue color filter 230B may be positioned in the blue light emitting area BLA, and the blue dummy color filter 231R may be positioned in the non-light emitting area NLA overlapping the bank 320. In FIG. 1, although the blue color filter 230B and the blue dummy color filter 231B are shown as separate components, the blue color filter 230B and the blue dummy color filter 231B may be connected to each other or integrally formed with each other as a single unitary unit.

Figure 2:
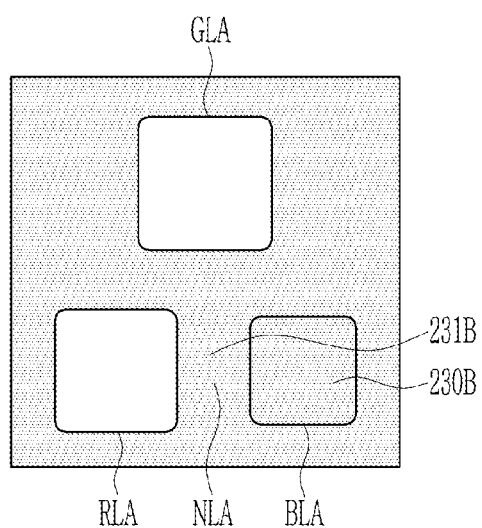
FIG. 2 to FIG. 4 show the stacking order of a blue color filter, a red color filter, and a green color filter.
Figure 3:
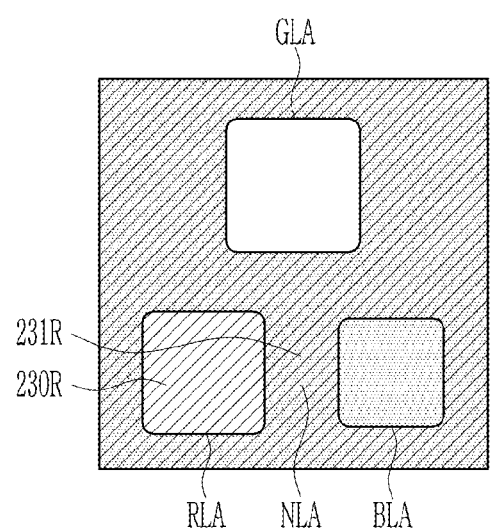
Figure 4:
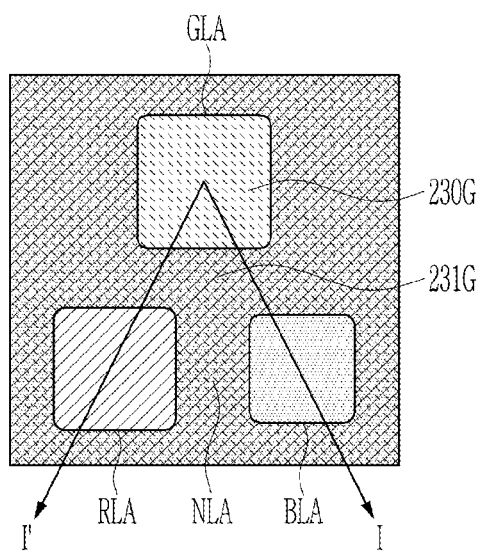

FIG. 2 to FIG. 4 show the stacking order of the blue color filter 230B, the red color filter 230R, and the green color filter 230G. A cross-section cut along the line I-I' in FIG. 4 may correspond to FIG. 1.

Referring to FIG. 2, a color filter of blue is positioned in all regions except for a green light emitting area GLA and a red light emitting area RLA. Among these blue color filters, a portion of the color filter of blue positioned in the blue light emitting area BLA defines a blue color filter 230B, and a portion of the color filter of blue positioned in a non-light emitting area NLA defines a blue dummy color filter 231B. In FIG. 1, edge portions of the blue color filter 230B, which is a blue dummy color filter 231B, correspond to non-light emitting areas NLA overlapping the bank 320.

Referring to FIG. 1 and FIG. 3, the red color filter 230R and a red dummy color filter 231R are positioned on the blue color filter 230B and the dummy color filter 231B. Referring to FIG. 3, a color filter of red is positioned in all regions except for the green light emitting area GLA and the blue light emitting area BLA. In such an embodiment, a portion of the color filter of red positioned in the red light emitting area RLA defined a red color filter 230R, and a portion of the color filter of red positioned in the non-light emitting area NLA defines a red dummy color filter 231R. In FIG. 1, edges of the red color filter 230R are non-light emitting areas NLA overlapping with the bank 320, which is a red dummy color filter 231R.

Next, simultaneously referring to FIG. 1 and FIG. 4, a green color filter 230G and a green dummy color filter 231G are positioned on the blue color filter 230B and the blue dummy color filter 231B, and the red color filter 230R and the red dummy color filter 231R. Referring to FIG. 4, a green color filter is positioned in all regions except the blue light emitting area BLA and the red light emitting area RLA. Among these green color filters, a color filter of green positioned in the green light emitting area GLA is a green color filter 230G, and a color filter of green positioned in the non-light emitting area NLA is a green dummy color filter 231G. In FIG. 1, edge portions of the green color filter 230G, which is the green dummy color filter 231G, correspond to non-light emitting areas NLA overlapping the bank 320.

Referring to FIG. 1, the blue dummy color filter 231B, the red dummy color filter 231R, and the green dummy color filter 231G are positioned to overlap in a region overlapping the bank 320. The blue dummy color filter 231B, the red dummy color filter 231R, and the green dummy color filter 231G overlap to form a color filter overlapping body A.

Such a color filter overlapping body A may function as a light blocking member. That is, the color filter overlapping body A may block light in the non-light emitting area NLA.

In an embodiment, the blue dummy color filter 231B may be positioned closer to the second substrate 210 than the red dummy color filter 231R and the green dummy color filter 231G are. The direction in which the user sees the image is toward the second substrate 210, and the blue dummy color filter 231B may be positioned on the side where the image is viewed. In such an embodiment, since blue has the lowest reflectance for the entire light compared to green or red, the color filter overlapping body A may block light most effectively.

Referring to FIG. 1, a low refractive layer 351 may be positioned on the color filter 230. The low refractive layer 351 may have a refractive index of about 1.2 or less. The low refractive layer 351 may include or be formed of a mixture of organic and inorganic materials. The low refractive layer 351 may have a single layer or a multi-layer structure.

A plurality of banks 320 are positioned on the low refractive layer 351. The banks 320 may be positioned to be spaced apart from each other with a plurality of openings therebetween, and each opening may overlap a corresponding one of the color filters 230R, 230G, and 230B in a direction that is perpendicular to a plane of the second substrate 210.

The bank 320 may include a scatterer. The scatterer may include at least one selected from $SiO_2$, $BaSO_4$, $Al_2O_3$, $ZnO$, $ZrO_2$, and $TiO_2$. The bank 320 may include a polymer resin and a scatterer included in the polymer resin. The content of the scatterers may be in a range of about 0.1 weight percent (wt %) to about 20 wt %. In an embodiment, for example, the content of the scatterer may be in a range of about 5 wt % to about 10 wt %. The bank 320 including the scatterers with such a range may scatter the light emitted from the display panel to increase the luminous efficiency. In an alternative embodiment, the bank 320 may contain a black material to block light and prevent color mixing between neighboring light emitting regions.

The red color conversion layer 330R, the green color conversion layer 330G, and the transmission layer 330B are positioned in a region between the banks 320 spaced apart from each other. In an embodiment, as shown in FIG. 1, the red color conversion layer 330R is positioned in a region overlapping with the red light emitting area RLA. The red color conversion layer 330R may convert the incident light into red. The red color conversion layer 330R may include quantum dots. In such an embodiment, as shown in FIG. 1, the green color conversion layer 330G is positioned in a region overlapping the green light emitting area GLA. The green color conversion layer 330G may convert the incident light into green light. The green color conversion layer 330G may include quantum dots.

Hereinafter, the quantum dots will be described in detail below.

In the disclosure, quantum dots (hereinafter referred to as semiconductor nanocrystals) may include a group II-VI compound, a group III-V compound, a group IV-VI compound, a group IV element or compound, a group compound, a group I-II-IV-VI compound, or a combination thereof.

The group II-VI compound may be selected from: a binary compound selected from CdSe, CdTe, ZnS, ZnSe, ZnTe, ZnO, HgS, HgSe, HgTe, MgSe, MgS, and a mixture thereof; a ternary element selected from AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The II-VI compound may further include a group III metal.

The group III-V compound may be selected from: a binary compound selected from GaN, GaP, GaAs, GaSb, AlN, AlP, AlAs, AlSb, InN, InP, InAs, InSb, and a mixture thereof; a ternary element selected from GaNP, GaNAs, GaNSb, GaPAs, GaPSb, AlNP, AlNAs, AlNSb, AlPAs, AlPSb, InGaP, InNP, InNAs, InNSb, InPAs, InZnP, InPSb, and a mixture thereof; and a quaternary compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, and a mixture thereof. The III-V compound may further include a group II metal (e.g., InZnP).

The group IV-VI compound may be selected from: a binary compound selected from SnS, SnSe, SnTe, PbS, PbSe, PbTe, and a mixture thereof; a ternary element selected from SnSeS, SnSeTe, SnSTe, PbSeS, PbSeTe, PbSTe, SnPbS, SnPbSe, SnPbTe, and a mixture thereof; and a quaternary compound selected from SnPbSSe, SnPbSeTe, SnPbSTe, and a mixture thereof.

The group IV element or compound may be selected from: a single element compound selected from Si, Ge and a combination thereof; and a binary compound selected from SiC, SiGe, and a combination thereof, but is not limited thereto.

Examples of the group compound include $CuInSe_2$, $CuInS_2$, CuInGaSe, and CuInGaS, but are not limited thereto. Examples of the group I-II-IV-VI compound include CuZnSnSe and CuZnSnS, but are not limited thereto. The group IV element or compound may be selected from: a single element compound selected from Si, Ge, and a combination thereof; and a binary compound selected from SiC, SiGe, and a combination thereof, but is not limited thereto.

The group compound may be selected from ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAlS, HgInS, HgGaSe, HgAlSe, HgInSe, HgGaTe, HgAlTe, HgInTe, MgGaS, MgAlS, MgInS, MgGaSe, MgAlSe, MgInSe, and a combination thereof, but this is not restrictive.

The group I-II-IV-VI compound may be selected from, but is not limited to, CuZnSnSe and CuZnSnS.

In one embodiment, the quantum dots may not contain cadmium. The quantum dots may include semiconductor nanocrystals based on group III-V compounds including indium and phosphorus. The III-V compound may further include zinc. The quantum dot may include a semiconductor nanocrystal based on a group II-VI compound including a chalcogen element (e.g., sulfur, selenium, tellurium, or a combination thereof) and zinc.

In the quantum dot, the above-described binary compound, ternary compound, and/or quaternary compound may exist in a particle at a uniform concentration, or may exist in the same particle because the concentration distribution is partially divided into different states. In addition, one quantum dot may have a core/shell structure surrounding another quantum dot. The interface between the core and the shell may have a concentration gradient in which the concentration of elements present in the shell decreases toward the center.

In some embodiments, quantum dots may have a core-shell structure including a core containing the aforementioned nanocrystals and a shell surrounding the core. The shell of the quantum dot may serve as a protective layer for maintaining the semiconductor characteristic by preventing chemical denaturation of the core and/or as a charging layer for imparting an electrophoretic characteristic to the quantum dot. The shell may be single-layered or multi-layered. The interface between the core and the shell may have a concentration gradient in which the concentration of elements present in the shell decreases toward the center. Examples of the shell of the quantum dot include a metal or non-metal oxide, a semiconductor compound, or a combination thereof.

In an embodiment, for example, the metal or non-metal oxide may be a binary compound such as S $SiO_2$, $Al_2O_3$, $TiO_2$, ZnO, MnO, $Mn_2O_3$, $Mn_3O_4$, CuO, FeO, $Fe_2O_3$, $Fe_3O_4$, CPO, $Co_3O_4$, and NiO, or a ternary compound such as $MgAl_2O_4$, $CoFe_2O_4$, $NiFe_2O_4$, and $CoMn_2O_4$, but the present invention is not limited thereto.

In an embodiment, for example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but the invention is not limited thereto.

The interface between the core and the shell may have a concentration gradient in which the concentration of elements present in the shell decreases toward the center. In addition, the semiconductor nanocrystal may have a structure including one semiconductor nanocrystal core and a multi-layered shell surrounding the semiconductor nanocrystal core. In an embodiment, the multi-layered shell may have two or more layers, for example, two, three, four, five, or more layers. Two adjacent layers of the shell may have a single composition or different compositions. In a multi-layered shell, each layer may have a composition that varies along the radius.

Quantum dots may have a full width at half maximum (FWHM) of a light emitting wavelength spectrum of about 45 nanometers (nm) or less, for example, about 40 nm or less, or about 30 nm or less, and improve color purity or color reproducibility within this range. In addition, the light emitted through the quantum dots is emitted in all directions, and thus a light viewing angle can be improved.

In the quantum dot, the shell material and the core material may have different energy bandgaps. In an embodiment, for example, the energy bandgap of the shell material may be greater than that of the core material. In other embodiments, the energy bandgap of the shell material may be smaller than that of the core material. The quantum dot may have a multi-layered shell. In a multi-layered shell, the energy bandgap of the outer layer may be larger than that of the inner layer (i.e., the layer closer to the core). In the multi-layered shell, the energy bandgap of the outer layer may be smaller than the energy bandgap of the inner layer.

The quantum dots may control the absorption/light emitting wavelength by adjusting the composition and size. The maximum light emitting peak wavelength of the quantum dot may have a wavelength range of ultraviolet (UV) to infrared wavelengths or higher.

The quantum dot may have quantum efficiency of about 10% or more, for example, about 30% or more, about 50% or more, about 60% or more, about 70% or more, about 90% or more, or even about 100%. The quantum dots may have a relatively narrow spectrum. The quantum dot may have a half maximum width of a light emitting wavelength spectrum of about 50 nm or less, for example, about 45 nm or less, about 40 nm or less, or about 30 nm or less.

The quantum dot may have a particle size of about 1 nm or more and about 100 nm or less. The particle size refers to a diameter of the particle or a diameter converted by assuming a spherical shape from the two-dimensional (2D) image obtained by transmission electron microscope analysis. The quantum dot may have a size of about 1 nm to about 20 nm, for example, 2 nm or more, 3 nm or more, or 4 nm or more and 50 nm or less, 40 nm or less, 30 nm or less, 20 nm or less, or 15 nm or less, and for example, may have a size of 10 nm or less. A shape of the quantum dot is not particularly limited. In an embodiment, for example, the shape of the quantum dot may include, but is not limited to, a sphere, a polyhedron, a pyramid, a multi-pod, a square, a rectangular parallelepiped, a nanotube, a nano rod, a nanowire, a nano sheet, or a combination thereof.

Quantum dots are commercially available or can be appropriately synthesized. For quantum dots, particle size can be controlled relatively freely during colloid synthesis, and particle size can be uniformly controlled.

The quantum dots may include organic ligands (e.g., having a hydrophobic moiety and/or a hydrophilic moiety). The organic ligand moiety may be bound to the surface of the quantum dot. The organic ligand may include RCOOH, $RNH_2$, $R_2NH$, $R_3N$, RSH, $R_3PO$, $R_3P$, ROH, RCOOR, $RPO(OH)_2$, RHPOOH, RHPOOH, or a combination thereof. Here, each R may independently be a C3 to C40 substituted or unsubstituted aliphatic hydrocarbon group such as a C3 to C40 (e.g., C5 or more and C24 or less) substituted or unsubstituted alkyl, a substituted or unsubstituted alkenyl, and the like, or may be a substituted or unsubstituted aromatic hydrocarbon group of C6 to C40 (e.g., C6 or more and C20 or less), such as a substituted or unsubstituted C6 to C40 aryl group, or a combination thereof.

Examples of the organic ligand include thiol compounds such as methane thiol, ethane thiol, propane thiol, butane thiol, pentane thiol, hexane thiol, octane thiol, dodecane thiol, hexadecane thiol, octadecane thiol, and benzyl thiol; amines such as methaneamine, ethaneamine, propane amine, butaneamine, pentylamine, hexylamine, octylamine, nonylamine, decylamine, dodecylamine, hexadecylamine, octadecylamine, dimethylamine, diethylamine, dipropylamine, tributylamine, and trioctylamine; carboxylic acid compounds such as methanic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, and benzoic acid; phosphine compounds such as methyl phosphine, ethyl phosphine, propyl phosphine, butyl phosphine, pentyl phosphine, octyl phosphine, dioctyl phosphine, tributyl phosphine, trioctyl phosphine, and the like; phosphines such as methyl phosphine oxide, ethyl phosphine oxide, propyl phosphine oxide, butyl phosphine oxide, pentyl phosphine oxide, tributyl phosphine oxide, octyl phosphine oxide, dioctyl phosphine oxide, trioctyl phosphine oxide, and the like, or an oxide compound thereof; a diphenyl phosphate spin, a triphenyl phosphate spin compound or its oxide compound; a C5 to C20 alkyl phosphinic acid or a C5 to C20 alkyl phosphonic acid such as hexylphosphinic acid, octylphosphinic acid, dodecanephosphinic acid, tetradecane phosphinic acid, hexadecane phosphinic acid, octadecane phosphinic acid; and the like, but are not limited thereto. Quantum dots may contain hydrophobic organic ligands alone or as a mixture of more than one. The hydrophobic organic ligand (e.g., an acrylate group, a methacrylate group, and the like) may not contain a photopolymerizable moiety.

Referring to FIG. 1, a color conversion layer is not positioned in a portion corresponding to the blue light emitting area BLA among spaces partitioned by the banks 320. In such an embodiment, the transmission layer 330B may be positioned in the portion corresponding to the blue light emitting area BLA. The transmission layer 330B may include a scatterer. The scatterer may include at least one selected from $SiO_2$, $BaSO_4$, $Al_2O_3$, ZnO, $ZrO_2$, and $TiO_2$. The transmission layer 33B may include a polymer resin and a scatterer included in the polymer resin. In an embodiment, for example, the transmission layer 330B may include $TiO_2$, but this is not restrictive. The transmission layer 330B may transmit light incident from the display panel.

In the color conversion panel according to an embodiment, the red light emitting area RLA color-converts incident light to red and emits the color-converted light. In addition, the green light emitting area GLA color-converts incident light to green and emits the color-converted light. However, the blue light emitting area BLA transmits incident light without color conversion. The incident light may include blue light. The incident light may be blue light alone or a mixture of blue light and green light. Alternatively, blue light, green light, and red light may all be included in the incident light.

Referring to FIG. 1, a color conversion panel according to an embodiment includes a reflective layer 400 positioned on the color conversion layers 330R and 330G. The reflective layer 400 may include a first layer 410, a second layer 420, and a third layer 430. In such an embodiment, refractive indexes of the first layer 410, the second layer 420, and the third layer 430 may be different from each other. As the first layer 410, the second layer 420, and the third layer 430 having different refractive indices from each other are stacked in such a way, the reflective layer 400 transmits blue light and reflects green light and red light to increase light output efficiency.

As shown in FIG. 1, the first layer 410 of the reflective layer 400 is a layer positioned closest to the second substrate 210, and the third layer 430 is a layer positioned farthest from the second substrate 210. The second layer 420 is a layer positioned between the first layer 410 and the third layer 430.

Figure 5:
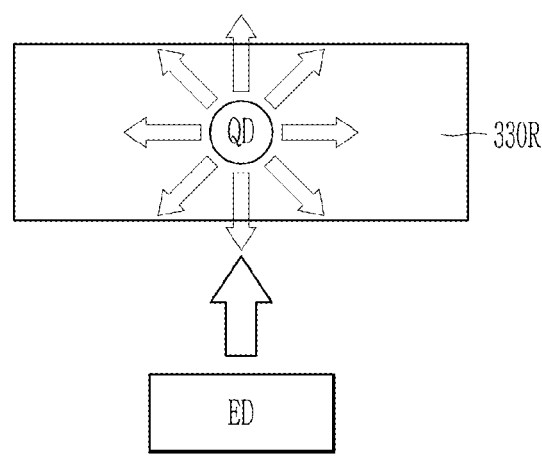
FIG. 5 illustrates an output direction of the red light color-converted by quantum dots when blue light is incident on the red color conversion layer from a light emitting diode.

FIG. 5 illustrates an output direction of the red light color-converted by the quantum dots QD when the blue light is incident on the red color conversion layer 330R from the light emitting diode ED. As shown in FIG. 5, the color-converted light in the quantum dot QD is emitted in all directions. Therefore, as shown in FIG. 5, about 50% of the color-converted light is emitted in a rear direction. The luminous efficiency may be increased when the light emitted to the rear surface is reflected and emitted to the front surface.

Accordingly, in the color conversion panel according to an embodiment and the display device including the color conversion panel, the reflective layer 400 may be positioned on one surface of the color conversion layer. The reflective layer 400 may have high reflectance with respect to color-converted green light and red light while transmitting the incident blue light. Therefore, the light emitted in the rear direction among the red light and green light converted by the color conversion layer may be reflected back to the front side, and luminous efficiency may be increased.

In an embodiment of the invention, in the reflective layer 400, the reflectance of the first layer 410 is the lowest, the reflectance of the second layer 420 is the highest, and the reflectance of the third layer 430 may have a value between the reflectance of the first layer 410 and the reflectance of the second layer 420. That is, the refractive indices of layers of the reflective layer 400 may increase in the order of the first layer 410, the third layer 430 and the second layer 420 (i.e., the refractive index of the first layer 410<the refractive index of the third layer 430<the refractive index of the second layer 420. In such an embodiment, as described above, the first layer 410 is a layer positioned closest to the color conversion layers 330R and 330G, and the third layer 430 is a layer positioned farthest from the color conversion layers 330R and 330G. The second layer 420 is a layer positioned between the first layer 410 and the third layer 430.

A refractive index of the first layer 410 may be in a range of about 1.35 to about 1.45. In addition, a thickness of the first layer 410 may be in a range of about 120 nm to about 140 nm. The first layer 410 may include $SiO_x$, for example, but is not limited thereto. That is, the first layer 410 may include any material that allows the first layer 410 to have the refractive index in a range of about 1.35 to about 1.45.

A refractive index of the second layer 420 may be in a range of about 1.92 to about 2.02. In addition, a thickness of the second layer may be in a range of about 90 nm to about 110 nm. The second layer 420 may include $SiN_x$, for example, but is not limited thereto. That is, the second layer 420 may include any material that allows the second layer 420 may to have the refractive index in a range of about 1.92 to about 2.02.

A refractive index of the third layer 430 may be in a range of about 1.55 to about 1.65. In addition, a thickness of the third layer may be in a range of about 120 nm to about 140 nm. The third layer 430 may include $SiO_xN_y$, for example, but is not limited thereto. That is, the third layer 430 may include any material that allows the third layer 430 may to have 1.55 to 1.65, it can be applied to the third layer 430.

As will be described later, the refractive index range and thickness range of the first layer 410, the second layer 420, and the third layer 430 are ranges determined to transmit blue light and selectively reflect only green light and red light.

In an embodiment, as described above, the refractive index of the reflective layer 400 may increase in the order of the first layer 410, the third layer 430 and the second layer 420. In addition, the thickness of the second layer 420 may be thinner than that of the first layer 410 and third layer 430. As will be described later, as the thickness of the second layer 420 having the highest refractive index is increased, reflectance of green and red light is reduced.

Next, an effect of the color conversion panel including the reflective layer according to an embodiment will be described below.

Figure 6:
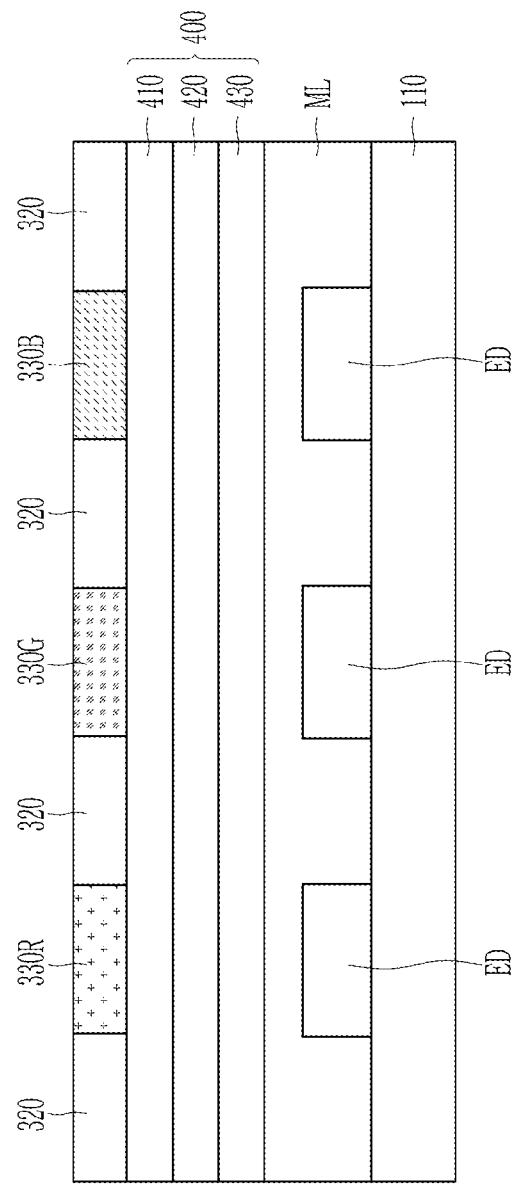
FIG. 6 schematically illustrates a display device according to an embodiment.

FIG. 6 schematically illustrates a display device according to an embodiment. A light emitting diode ED is positioned on a first substrate 110. The light emitting diode ED may be, but is not limited to, an organic light emitting diode or a nano light emitting diode. The light emitting diode ED may emit blue light.

A middle layer ML may be positioned on the light emitting diode ED. The middle layer ML may be an insulation layer including an organic layer or an inorganic layer. The reflective layer 400 including the first layer 410, the second layer 420, and the third layer 430 is positioned on the middle layer ML. The bank 320, the red color conversion layer 330R, the green color conversion layer 330G, and the transmission layer 330B are positioned on the reflective layer 400. The red color conversion layer 330R, the green color conversion layer 330G, and the transmission layer 330B may be positioned to overlap the light emitting diode ED.

In an embodiment shown in FIG. 6, the first layer 410 may have a refractive index of about 1.40 and a thickness of about 130 nm. In addition, the second layer 420 may have a refractive index of about 1.97 and a thickness of about 100 nm. The third layer 430 may have a refractive index of about 1.60 and a thickness of about 130 nm. In such an embodiment, for example, the first layer 410 may include $SiO_x$, the second layer 420 may include $SiN_x$, and the third layer 430 may include $SiO_xN_y$.

Figure 7:
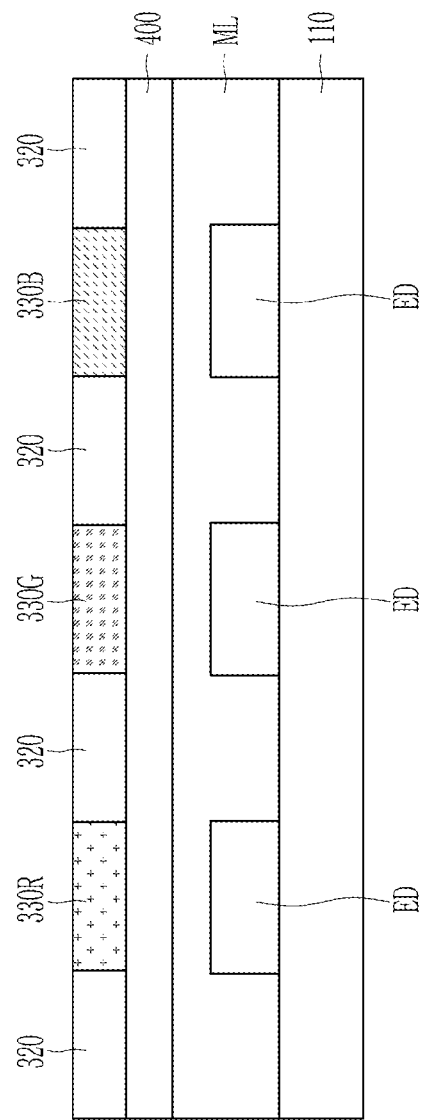
FIG. 7 illustrates a display device according to an alternative embodiment.

FIG. 7 illustrates a display device according to an alternative embodiment. The display device of FIG. 7 is substantially the same as the display device of FIG. 6, except that a reflective layer 400 is formed of or defined by a single layer. Any repetitive detailed description of the same or like constituent elements as those described above will hereinafter be omitted. The reflective layer 400 of the embodiment of FIG. 7 may have a refractive index in a range of about 1.9 to about 2.0 and a thickness of about 4000 nm. The reflective layer 400 of FIG. 7 may include $SiN_x$.

Figure 8:
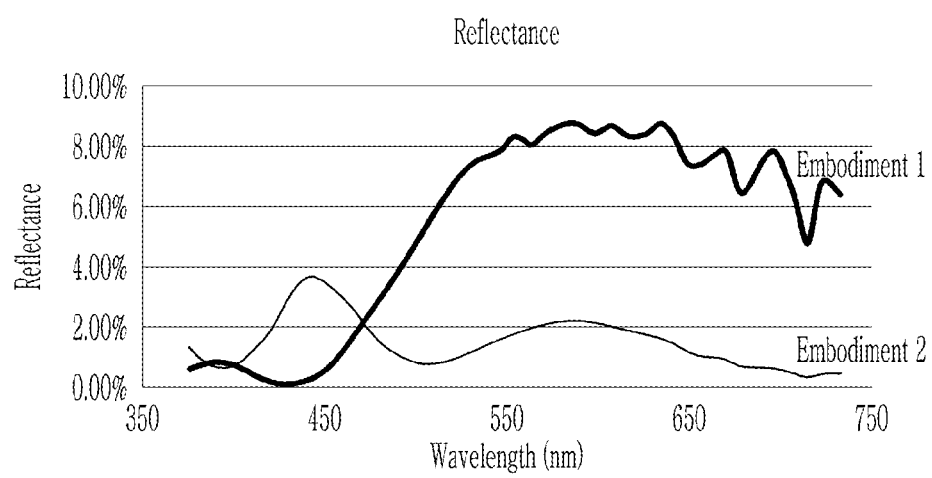
FIG. 8 shows a graph illustrating reflectance versus wavelengths in accordance with the color conversion panel (Embodiment 1) of FIG. 6 and the color conversion pane (Embodiment 2) of FIG. 7.

FIG. 8 shows a graph illustrating reflectance versus wavelengths in accordance with the color conversion panel (Embodiment 1) of FIG. 6 and the color conversion pane (Embodiment 2) of FIG. 7. Referring to FIG. 8, in the case of Embodiment 2 in which the reflective layer 400 is a single layer, it was confirmed that reflectance of a blue light region (near 450 nm) was high, and reflectance of a red light region (near 650 nm) and a green light region (near 550 nm) was low. In this case, since the incident blue light is reflected and the red light and green light emitted to the rear are transmitted without reflection after color conversion, overall luminous efficiency may decrease.

However, in the case of Embodiment 1 in which the reflective layer 400 includes the first layer 410, the second layer 420, and the third layer 430, it was confirmed that reflectance for a blue light region (near 450 nm) is low, and reflectance of a green light region (near 550 nm) and a red light region (near 650 nm) was high. Therefore, in this case, it the luminous efficiency may be increased by transmitting the incident blue light and reflecting the red and green light emitted to the rear side after color conversion to emit the light to the front side.

Figure 9:
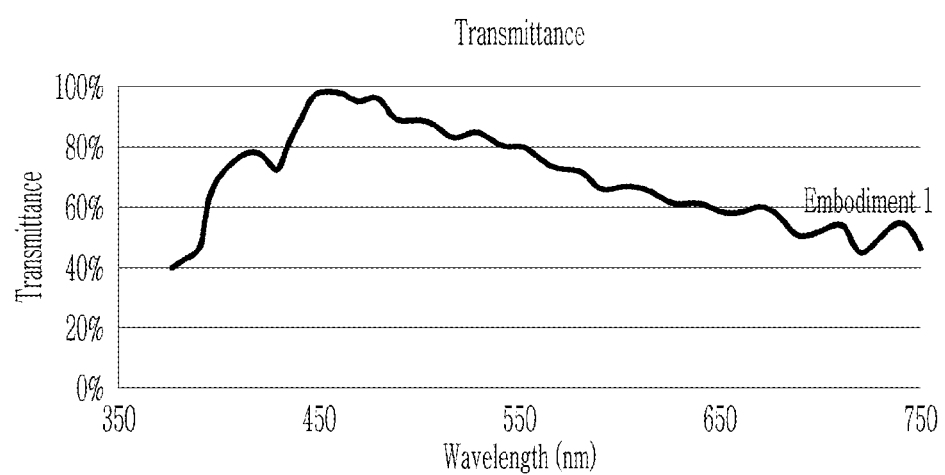
FIG. 9 is a graph that shows transmittance of each wavelength measured with respect to the embodiment (Embodiment 1) of FIG. 6.

FIG. 9 is a graph that shows transmittance of each wavelength measured with respect to the embodiment (Embodiment 1) of FIG. 6. Referring to FIG. 9, it was confirmed that the color conversion panel according to an embodiment had high transmittance for blue light and low transmittance for green light and red light.

As described above, a reflective layer having a structure, in which three layers having different refractive indices from each other are stacked one on another, transmits blue light and reflects green light and red light. Therefore, in an embodiment where the reflective layer is positioned on the rear surface of the color conversion layer, the incident blue light is transmitted while the color conversion layer is color-converted and reflects the red and green light emitted to the rear surface, thereby improving the luminous efficiency. In such an embodiment, the stacked structure of the reflective layer may have ae structure of color conversion layer/low refractive layer/high refractive layer/medium refractive layer/light emitting element, as described above. This is because the structure in which the low refractive layer/high refractive layer/medium refractive layer sequentially stacked may transmit light in the blue light region and reflect light in the red light and green light regions. In the disclosure, a low refractive layer is a layer corresponding to the first layer 410 and means a layer having a refractive index in a range of about 1.35 to about 1.45. The high refractive index layer corresponds to the second layer 420 and refers to a layer having a refractive index in a range of about 1.92 to about 2.02. The middle refractive layer is a layer corresponding to the third layer 430 and refers to a layer having a refractive index in a range of about 1.55 to about 1.65.

FIG. 10 to FIG. 13 show the measurement of reflectance for each wavelength while varying the stacking order of the low refractive layer/high refractive layer/medium refractive layer of the reflective layer. In experimental examples of FIG. 11 to FIG. 13, a low refractive layer has a refractive index of about 1.40 and a thickness of about 130 nm, a high refractive layer has a refractive index of about 1.97 and a thickness of about 100 nm, and a medium refractive layer has a refractive index of about 1.60 and a thickness of about 130 nm. The low refractive layer includes $SiO_x$, the high refractive layer includes $SiN_x$, and the medium refractive layer includes $SiO_xN_y$.

Figure 10:
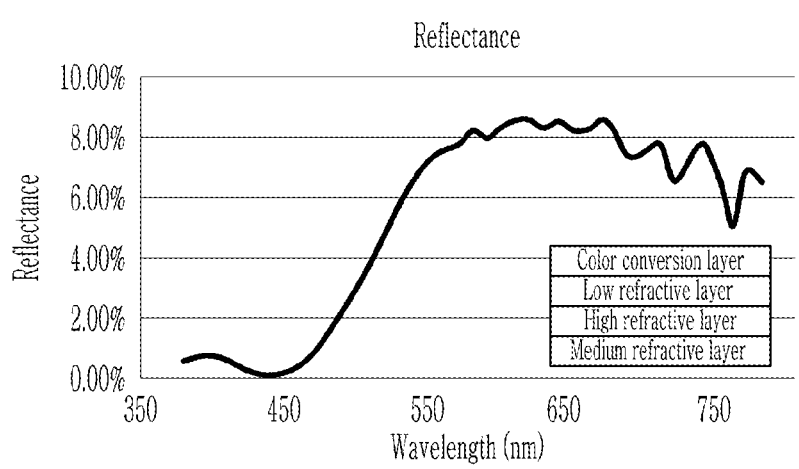
FIG. 10 to FIG. 13 show the measurement of reflectance for each wavelength while varying the stacking order of the low refractive layer/high refractive layer/medium refractive layer of the reflective layer.

FIG. 10 shows reflectance versus wavelength for a reflective layer having a color conversion layer/low refractive layer/high refractive layer/medium refractive layer structure. As in the embodiment FIG. 6, FIG. 10 shows a structure of color conversion layer/low refractive layer/high refractive layer/medium refractive layer. Referring to FIG. 10, a reflective layer having a structure of color conversion layer/low refractive layer/high refractive layer/medium refractive layer has low reflectance for blue light and high reflectance for red light and green light. Therefore, light may be efficiently emitted to the front side by reflecting the red light and green light emitted to the rear side after color conversion.

Figure 11:
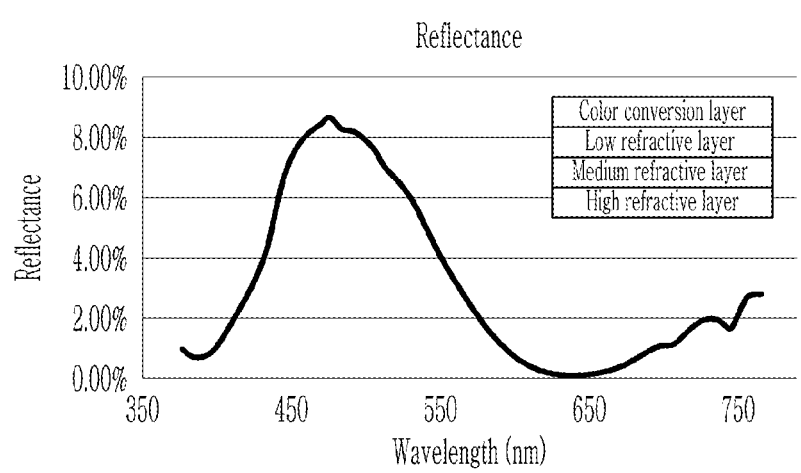

FIG. 11 shows reflectance versus wavelength for a reflective layer having a color conversion layer/low refractive layer/medium refractive layer/high refractive layer structure. Referring to FIG. 11, in the case of a reflective layer having such a structure, it was confirmed that the reflectance of blue light was high and that of red light and green light region was low. Therefore, it was confirmed that the reflective layer having such a stacked structure may not be desirable for application to the color conversion panel.

Figure 12:
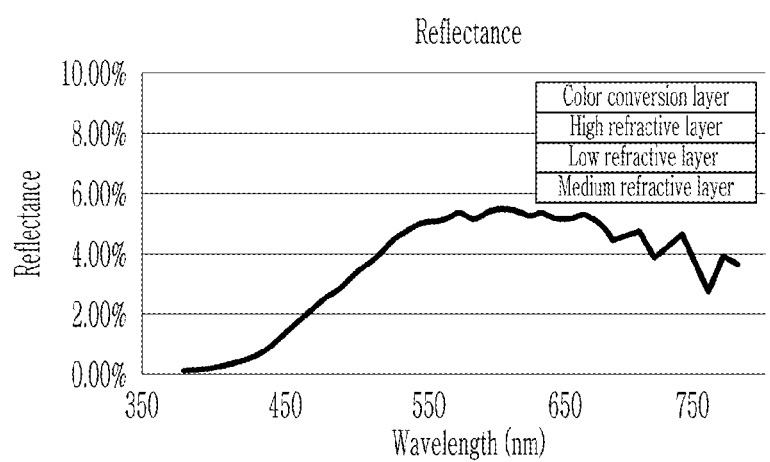

FIG. 12 shows reflectance versus wavelength for a reflective layer having a color conversion layer/high refractive layer/low refractive layer/medium refractive layer structure. Referring to FIG. 12, in the case of a reflective layer having such a structure, the reflectance to blue light is low and the reflectance to red light and green light is high. However, compared to FIG. 10, the structure of FIG. 12 shows that the reflectance (less than 6%) for red and green light was lower than the reflectance (more than 6%) of the reflective layer having a low refractive layer/high refractive layer/medium refractive layer structure of FIG. 10.

Figure 13:
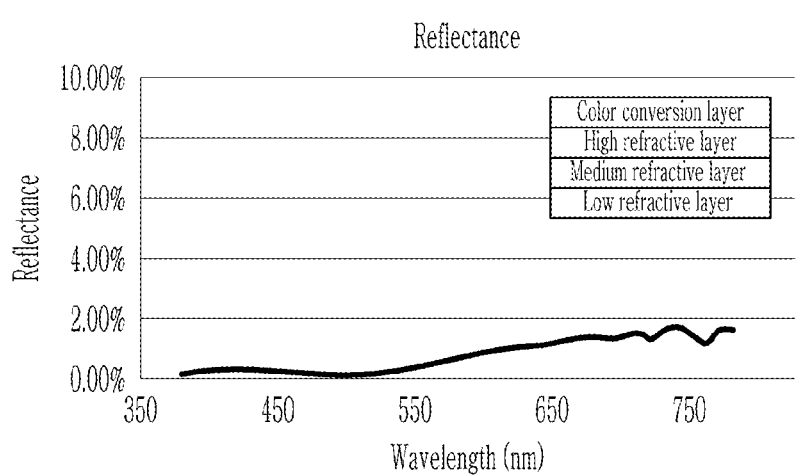

FIG. 13 shows reflectance versus wavelength for a reflective layer having a color conversion layer/high refractive layer/medium refractive layer/low refractive layer structure. Referring to FIG. 12, in the case of a reflective layer having this structure, the reflectance for blue light is low, and the reflectance for red light and green light is higher than the reflectance for blue light. However, compared to FIG. 10, the structure of FIG. 13 shows that the reflectance (less than 6%) for red and green light was lower than the reflectance (more than 6%) of the reflective layer having a low refractive layer/high refractive layer/medium refractive layer structure of FIG. 10.

That is, based on the results of FIG. 10 to FIG. 13, it was confirmed that the reflective layer (FIG. 10) having a color conversion layer/low refractive layer/high refractive layer/ medium refractive layer structure has the most desirable blue light transmission effect and red light and green light reflection effect. Therefore, as in an embodiment disclosed in FIG. 1 and FIG. 6, where the reflective layer is stacked to have a low refractive layer/high refractive layer/medium refractive layer structure, such that luminous efficiency effect is substantially improved.

Figure 14:
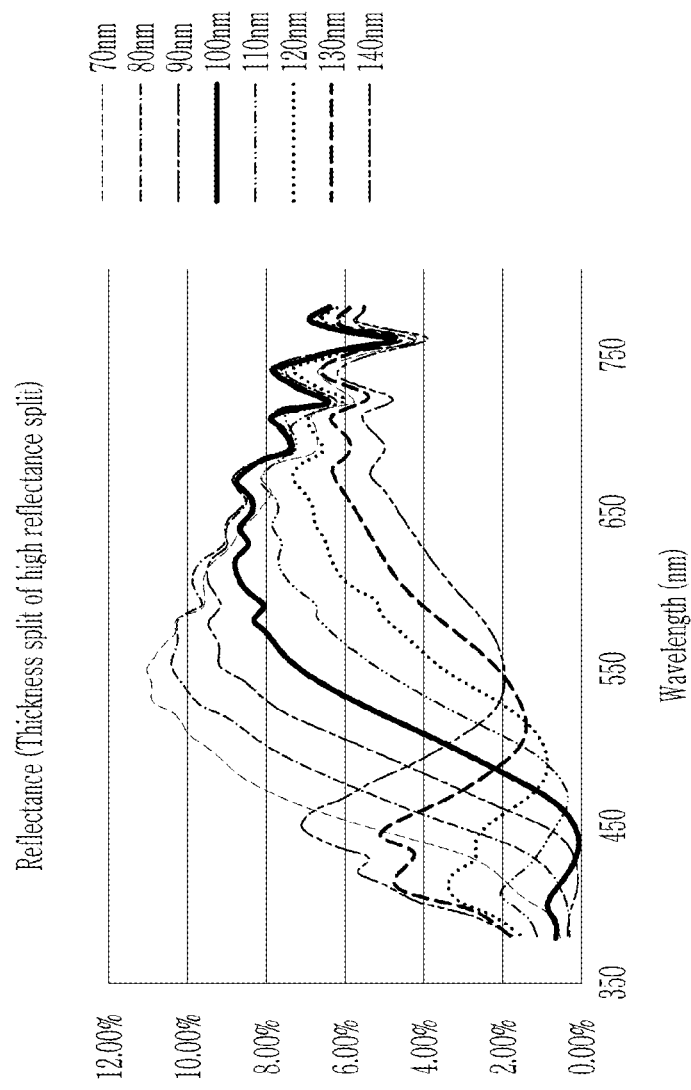
FIG. 14 shows the result of measuring the reflectance versus wavelength while varying the thickness of the second layer for the color conversion panel according to the embodiment of FIG. 1 and FIG. 6, after fixing the thickness of the first layer to about 130 nm and the thickness of the third layer to about 130 nm.

FIG. 14 shows the result of measuring the reflectance versus wavelength while varying the thickness of the second layer 420 for the color conversion panel according to the embodiment of FIG. 1 and FIG. 6, after fixing the thickness of the first layer 410 to about 130 nm and the thickness of the third layer 430 to about 130 nm. In an experimental example of FIG. 14, the first layer 410 has a refractive index of about 1.40 and a thickness of about 130 nm, and the third layer 430 has a refractive index of about 1.60 and a thickness of about 130 nm. The refractive index of the second layer 420 is about 1.97.

Referring to FIG. 14, it was confirmed that the reflectance in the blue light region was the lowest and the reflectance in the red light region and the green light region was high when the thickness of the second layer 420 was about 100 nm. When the thickness of the second layer 420 is decreased to be more than about 100 nm, the reflectance in the blue light region increases, which is not desirable. In addition, when the thickness of the second layer 420 is increased to more than 100 nm, it is undesirable because the reflectance in the red and green light regions decreases. Referring to FIG. 14, it was confirmed that the optimal thickness of the second layer 420 was in a range of about 90 nm to about 110 nm.

Figure 15:
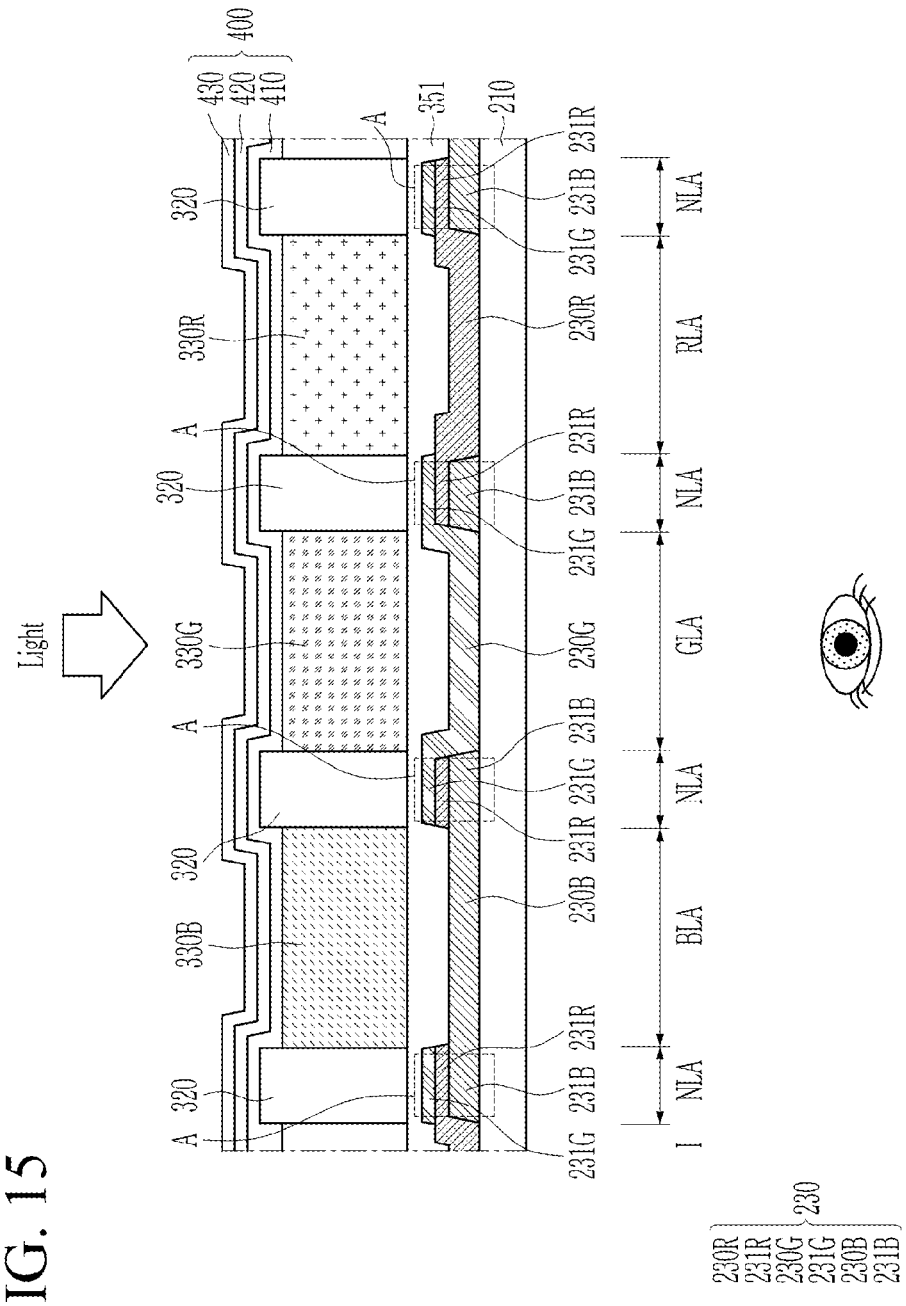
FIG. 15 illustrates an alternative embodiment corresponding to the cross-section of FIG. 1

Hereinabove, an embodiment in which the reflective layer 400 is positioned on the red color conversion layer 330R and the green color conversion layer 330G has been described, but not being limited thereto. Alternatively, the reflective layer 400 may be positioned on the transmission layer 330B. FIG. 15 illustrates an alternative embodiment corresponding to the cross-section of FIG. 1. A color conversion panel according to an embodiment of FIG. 15 is substantially the same as the color conversion panel according to the embodiment of FIG. 1 except that a reflective layer 400 is positioned on all of a red color conversion layer 330R, a green color conversion layer 330G, and a transmission layer 330B. Any repetitive detailed description of the same or like constituent elements as those described above will hereinafter be omitted.

Figure 16:
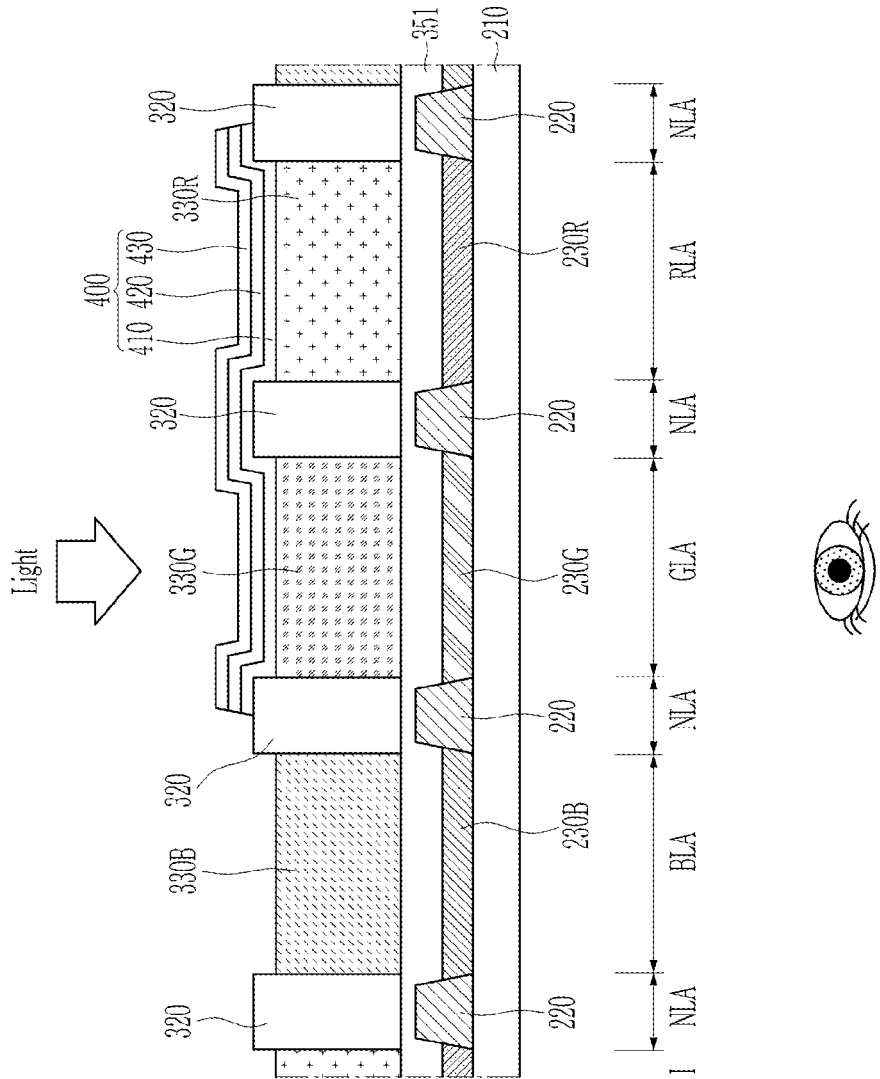
FIG. 16 illustrates an alternative embodiment corresponding to the cross-section of in FIG. 1.

In an embodiment, as shown in FIG. 1, the color filter overlapping body A overlaps the bank 320, but not being limited thereto. Alternatively, a light blocking member 220 may be positioned instead of the color filter overlapping body A. FIG. 16 illustrates an alternative embodiment corresponding to the cross-section of FIG. 1. A color conversion panel according to an embodiment of FIG. 16 is substantially the same as the color conversion panel according to the embodiment of FIG. 1, except that a light blocking member 220 is positioned instead of the color filter overlapping body A. Any repetitive detailed description of the same or like constituent elements as those described above will hereinafter be omitted.

In an embodiment, as described above, the reflective layer 400 including the first layer 410, the second layer 420, and the third layer 430 is provided, but not being limited thereto. Alternatively, the reflective layer 400 including the first layer 410, the second layer 420, and the third layer 430 may be repeatedly positioned to be multi-layered.

Figure 17:
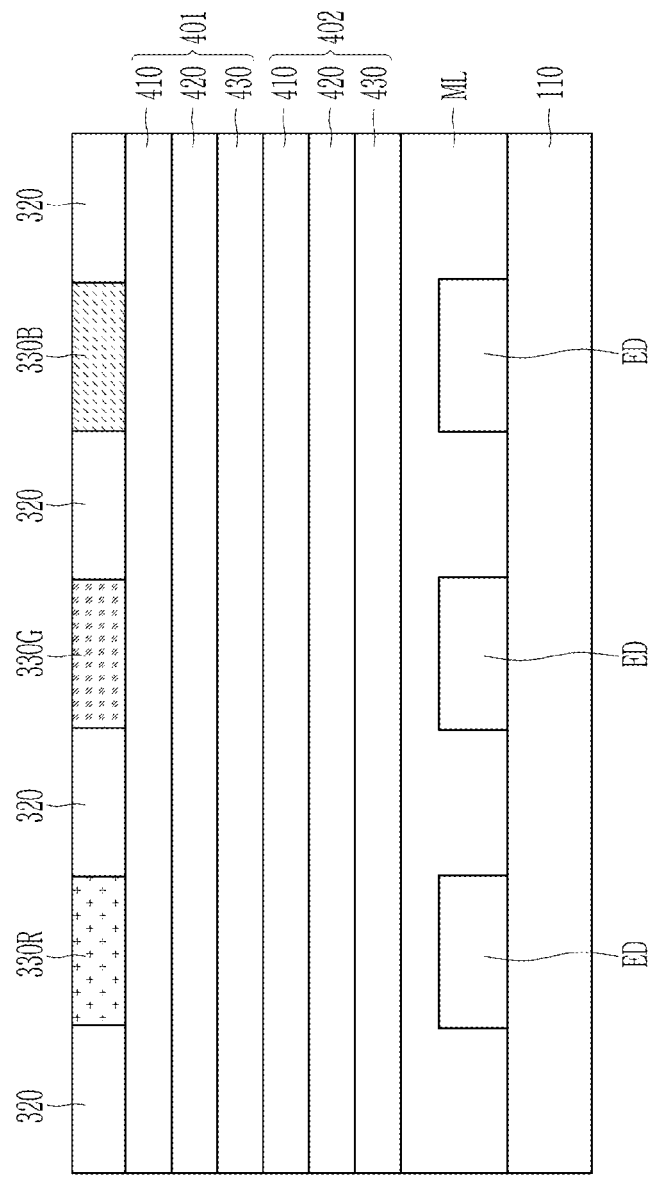
FIG. 17 illustrates an alternative embodiment corresponding the cross-section of FIG. 6.

FIG. 17 illustrates an alternative embodiment corresponding to the cross-section of FIG. 6. Referring to FIG. 17, a reflective layer according to an embodiment includes a first reflective layer 401 including a first layer 410, a second layer 420, and a third layer 430 and a second reflective layer 402 including a first layer 410, a second layer 420, and a third layer 430. That is, FIG. 17 is substantially the same as FIG. 16, except that the reflective layer formed of three layers is repeatedly provided in plural. Any repetitive detailed description of the same or like constituent elements as those described above will hereinafter be omitted.

In an embodiment of FIG. 17, the first layer 410, the second layer 420, and the third layer 430 are substantially the same as those in FIG. 1 and FIG. 6, and therefore any repetitive detailed descriptions thereof will be omitted. In the color conversion panel according to an embodiment of FIG. 17, a color conversion layer/a low refractive layer/a high refractive layer/a medium refractive layer/a low refractive layer/a high refractive layer/a medium refractive layer may be stacked in such an order. The meanings of the low refractive layer, the high refractive layer, and the medium refractive layer are the same as those described above.

Figure 18:
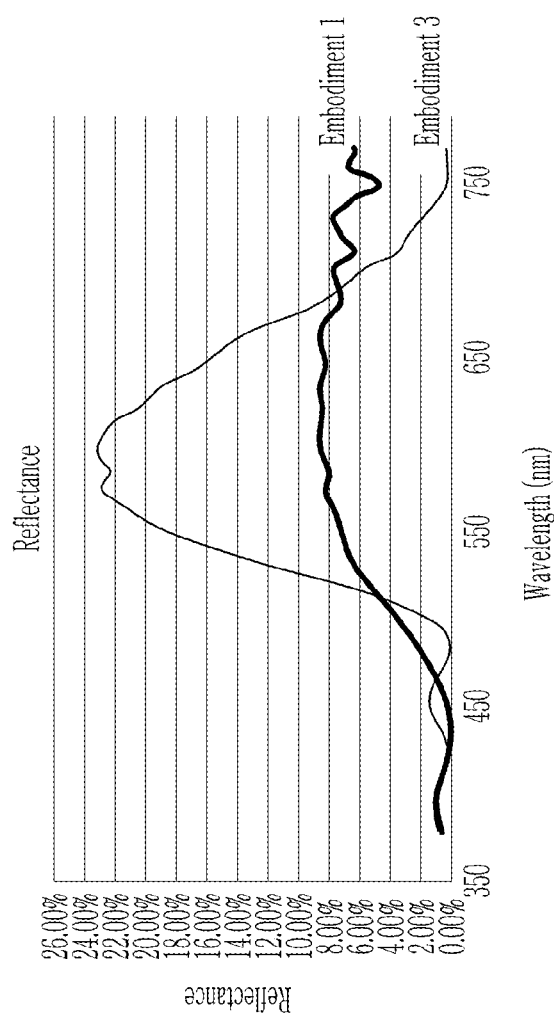
FIG. 18 illustrates reflectance (Embodiment 1) of the reflective layer according to the embodiment of FIG. 6, and reflectance (Embodiment 3) of the reflective layer according to the embodiment of FIG. 17.

FIG. 18 illustrates reflectance (Embodiment 1) of the reflective layer according to the embodiment of FIG. 6, and reflectance (Embodiment 3) of the reflective layer according to the embodiment of FIG. 17. Referring to FIG. 18, in the case of Embodiment 3 in which two reflective layers are provided, it was confirmed that the reflectance for green light and red light was higher than that of Embodiment 1. That is, it was confirmed that when the reflective layer 400 formed of triple layers are positioned in plurality, the reflectance for green light and red light is substantially improved.

Hereinafter, a display device including the color conversion panel according to an embodiment will be described. The color conversion panel described above may be combined with a display panel to configure a display device, or the color conversion panel may be provided or formed on the display panel to configure a display device.

Figure 19:
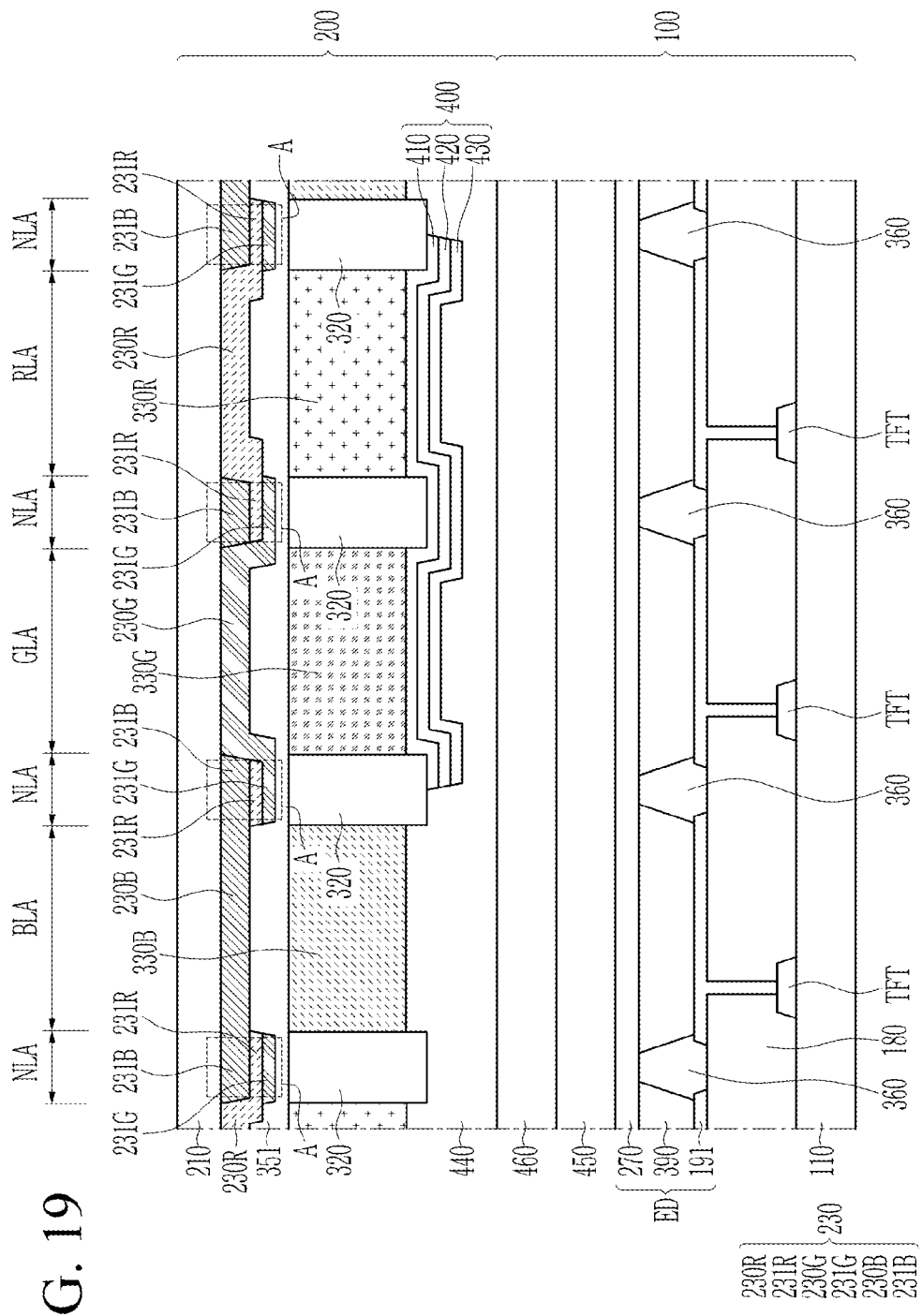
FIG. 19 simply illustrates a cross-section of a display device according to an embodiment.

FIG. 19 illustrates a cross-section of a display device according to an embodiment. Referring to FIG. 19, a display device according to the present embodiment includes a display panel 100 and a color conversion panel 200. In such an embodiment the color conversion panel 200 is substantially the same as that described above, and any repetitive detailed description thereof will be omitted. FIG. 19 shows an embodiment where the color conversion panel 200 is substantially the same as that shown in FIG. 1, but not being limited thereto. Alternatively, the color conversion panel 200 may be the same as that shown in FIG. 15 or FIG. 16.

The display panel 100 includes a first substrate 110, a plurality of transistors TFT positioned on the first substrate 110, and an insulation layer 180. The first electrode 191 and the partitioning wall 360 are positioned on the insulation layer 180, and the first electrode 191 is positioned at the opening of the partitioning wall 360 and connected to the transistor TFT. Although not specifically illustrated, the transistor TFT may include a semiconductor layer, a source electrode and a drain electrode connected to the semiconductor layer, and a gate electrode insulated from the semiconductor layer. A second electrode 270 is positioned on a partitioning wall 360, and a light emitting element layer 390 is positioned between a first electrode 191 and the second electrode 270. The first electrode 191, the second electrode 270, and the light emitting element layer 390 are collectively referred to as a light emitting diode ED. A plurality of light emitting diodes ED each may emit light of a different color, or light of a same color. In an embodiment, for example, the light emitting diode ED may emit light of red, green, and blue. Alternatively, the light emitting diode ED may emit blue light and green light. The light emitting diode ED may have a structure in which light emitting elements that emits light of different colors are stacked. In an embodiment, for example, the light emitting diode ED may have an emission layer that emits blue light and an emission layer that emits green light that are stacked. Alternatively, an emission layer that emits blue light/green light/red light may be stacked. The partitioning wall 360 contains a black material to prevent color mixing between neighboring light emitting diodes ED.

In an embodiment, as shown in FIG. 19, an encapsulation layer 450 may be positioned on the light emitting diode ED of the display panel 100. The encapsulation layer 450 may have a multi-layer structure in which an organic layer and an inorganic layer are alternately stacked. Among the multi-layered encapsulation layers 450, a layer positioned farthest from the first substrate 110 may include SiON.

A buffer layer 460 may be positioned between the encapsulation layer 450 and the first insulation layer 440. The buffer layer 460 may combine the display panel 100 and the color conversion panel 200 to each other. The buffer layer 460 may include an organic material. A refractive index of the buffer layer 460 may be in a range of about 1.6 to about 1.7. Such a refractive index is the most desirable or optimized refractive index range for the extraction efficiency of light emitted from the display panel 100.

In an embodiment, as shown in FIG. 19, a first insulation layer 440 positioned on top of the color conversion panel 200 may be included. The first insulation layer 440 is a layer for capping a red color conversion layer 330R, a green color conversion layer 330G, and a transmission layer 330B. The first insulation layer 440 may include $SiO_xN_y$. A thickness of the first insulation layer 440 may be in a range of about 3500 angstroms (Å) to about 4500 Å. A refractive index of the first insulation layer 440 may be in a range of about 1.4 to about 1.6. The first insulation layer 440 may include an inorganic material.

The display device according to the embodiment of FIG. 19 includes the color conversion panel 200 and the display panel 100. Thus, the display device includes two substrates such as the first substrate 110 included in the display panel 100 and the second substrate 210 included in the color conversion panel 200, but not being limited thereto. Alternatively, the display device may include only one substrate.

Figure 20:
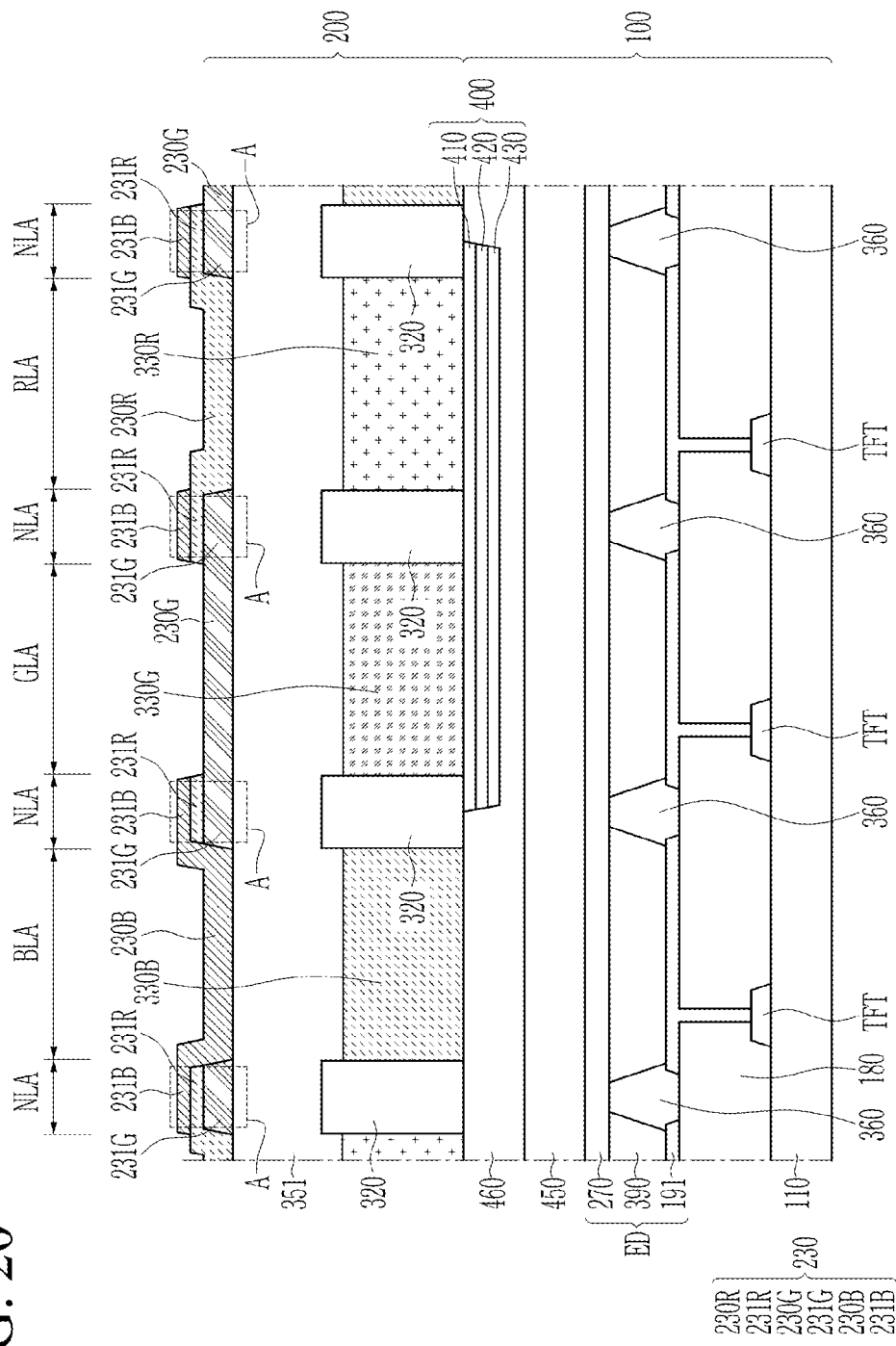
FIG. 20 illustrates an alternative embodiment corresponding the cross-section of FIG. 7.

FIG. 20 illustrates an alternative embodiment corresponding the cross-section of FIG. 7. The display device of FIG. 20 is substantially the same as the display device of FIG. 19 except that the display device of FIG. 20 includes a first substrate 110 and does not include a second substrate. In the embodiment of FIG. 20, other elements are the same as those in FIG. 19, and thus any repetitive detailed description thereof will be omitted. In such an embodiment, in a color conversion panel 200, a separate second substrate is not included. In such an embodiment, a bank 320 is positioned on a buffer layer 460.

The bank 320 is the same as those described above. Any repetitive detailed description of the same constituent elements as those described above will be omitted. In such an embodiment, the banks 320 may be positioned to be spaced apart from each other with a plurality of openings therebetween, and each opening may overlap each of color filters 230R, 230G, and 230B in a direction perpendicular to the surface of the first substrate 110.

A red color conversion layer 330R, a green color conversion layer 330G, and a transmission layer 330B are positioned in regions between the banks 320 spaced apart from each other. In an embodiment, as shown in FIG. 20, the red color conversion layer 330R is positioned in a region overlapping a red light emitting area RLA. The red color conversion layer 330R may convert the incident light into red. The red color conversion layer 330R may include quantum dots. Similarly, in FIG. 20, the green color conversion layer 330G is positioned in a region overlapping a green light emitting area GLA. The green color conversion layer 330G may convert the incident light into green. The green color conversion layer 330G may include quantum dots.

Referring to FIG. 20, a color conversion layer is not positioned in a portion corresponding to the blue light emitting area BLA among spaces partitioned by the banks 320. In such an embodiment, the transmission layer 330B may be positioned. The transmission layer 330B may include a scatterer. The scatterer may include at least one selected from $SiO_2$, $BaSO_4$, $Al_2O_3$, $ZnO$, $ZrO_2$, and $TiO_2$. The transmission layer 33B may include a polymer resin and a scatterer included in the polymer resin. In an embodiment, for example, the transmission layer 330B may include $TiO_2$, but this is not restrictive. The transmission layer 330B may transmit light incident from the display panel.

A low refractive layer 351 may be positioned on the transmission layer 330B. The low refractive layer 351 may have a refractive index of about 1.2 or less. The low refractive layer 351 may include a mixture of organic and inorganic materials.

A color filter 230 is positioned on the low refractive layer 351. The color filter 230 may include a blue color filter 230B and a blue dummy color filter 231B, and a green color filter 230G and a green dummy color filter 231G on a red color filter 230R and a red dummy color filter 231R. In such an embodiment, the blue color filter 230B and the blue dummy color filter 231B, and the green color filter 230G and the green dummy color filter 231G on the red color filter 230R and the red dummy color filter 231R is the same as those of FIG. 1, and therefore any repetitive detailed description thereof will be omitted.

In the embodiment of FIG. 20, the blue dummy color filter 231B may be positioned farthest from the first substrate 110. Thus, when viewing the display device according to the embodiment of FIG. 20, the blue dummy color filter 231B among the color filter overlapping body A may be positioned closest to the user. In such an embodiment, as described above, since blue has the lowest reflectance for the entire light compared to green or red, the color filter overlapping body A may block light most effectively.

Since only one substrate is included in the embodiment of FIG. 20, the thickness of the entire display device may be reduced. Therefore, it may be effectively applied to flexible or foldable display devices.

Hereinafter, a stacked structure of the display panel 100 will be described in greater detail as follows. However, the stacked structure of the display panel 100 is only an example, and the invention is not limited thereto.

Figure 21:
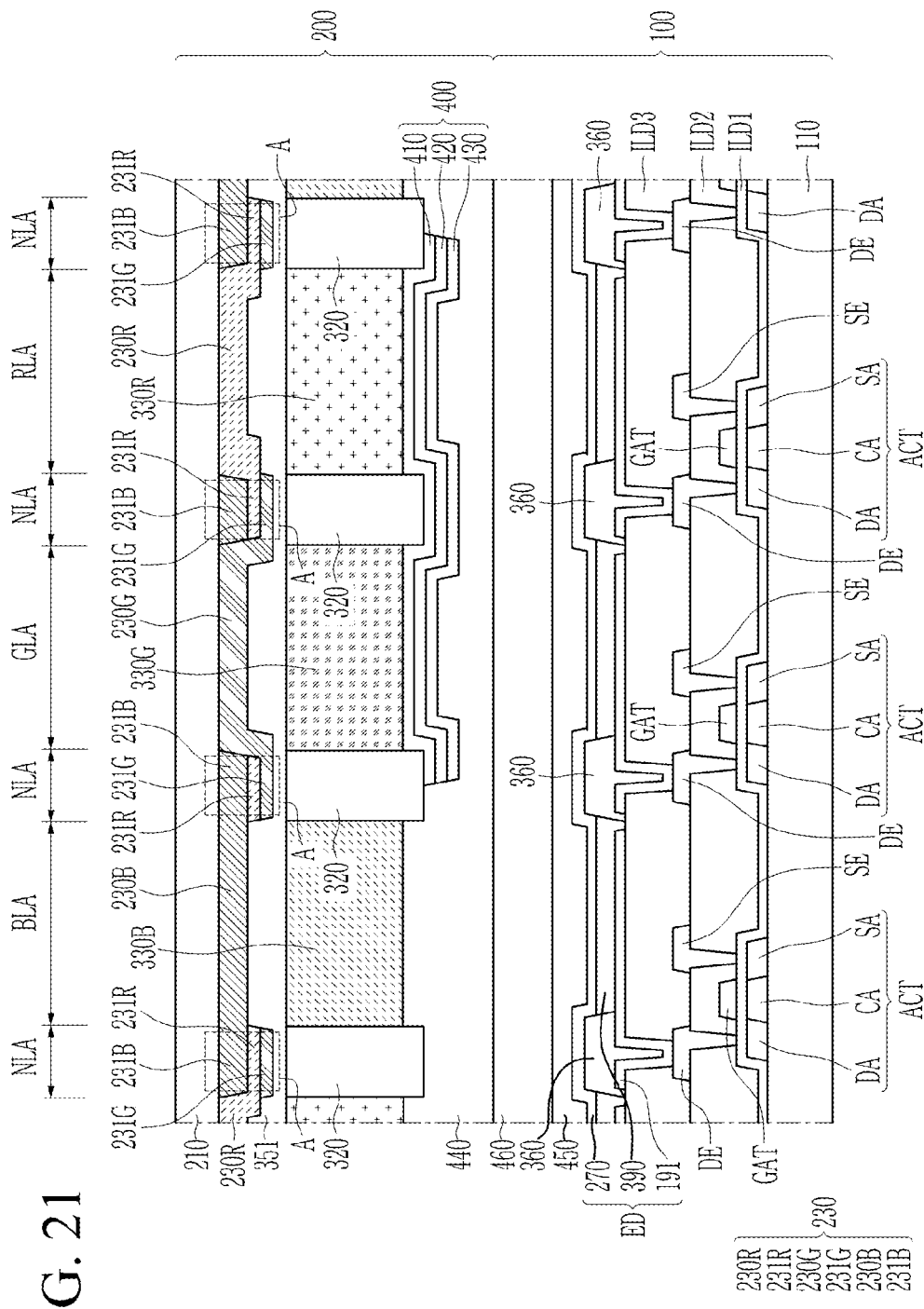
FIG. 21 shows a cross-section of a display device according to an alternative embodiment.

FIG. 21 shows a cross-section of a display device according to an alternative embodiment. Referring to FIG. 21, a display panel 100 according to an embodiment may include a first substrate 110 and a semiconductor layer ACT positioned on the first substrate 110. The semiconductor layer ACT may include a source area SA, a drain area DA, and a channel area CA.

A first interlayer insulating layer ILD1 may be positioned on the semiconductor layer ACT. A gate electrode GAT may be positioned on the channel area CA of the semiconductor layer ACT. The gate electrode GAT may be positioned with the semiconductor layer ACT and the first interlayer insulating layer ILD1 interposed therebetween. In FIG. 21, although an embodiment having a configuration in which the first interlayer insulating layer ILD1 is entirely positioned on the semiconductor layer ACT and the first substrate 110 is illustrated, but not being limited thereto. Alternatively, the first interlayer insulating layer ILD1 may be positioned only between the channel area CA of the semiconductor layer ACT and the gate electrode GAT.

A second interlayer insulating layer ILD2 may be positioned on the gate electrode GAT. A source electrode SE and a drain electrode DA may be positioned on the second interlayer insulating layer ILD2. The source electrode SE and the drain electrode DE may contact the source area SA and the drain area DA of the semiconductor layer ACT through an opening defined or formed in the second interlayer insulating layer ILD2, respectively.

A third interlayer insulating layer ILD3 is positioned on the source electrode SE and the drain electrode DE. A first electrode 191 is positioned on the third interlayer insulating layer ILD3, and the first electrode 191 may contact the drain electrode DE through an opening defined or formed in the third interlayer insulating layer ILD3. A partitioning wall 360 may be positioned on the first electrode 191. The partitioning wall 360 includes or defines a plurality of openings, and the first electrode 191 may be positioned in the opening.

A second electrode 270 is positioned on the partitioning wall 360, and a light emitting element layer is positioned between the first electrode 191 and the second electrode 270. The first electrode 191, the second electrode 270, and the light emitting element layer 390 are collectively referred to as a light emitting diode ED.

Other constituent elements are the same as those in the embodiment of FIG. 19, and therefore any repetitive detailed description thereof will be omitted.

Figure 22:
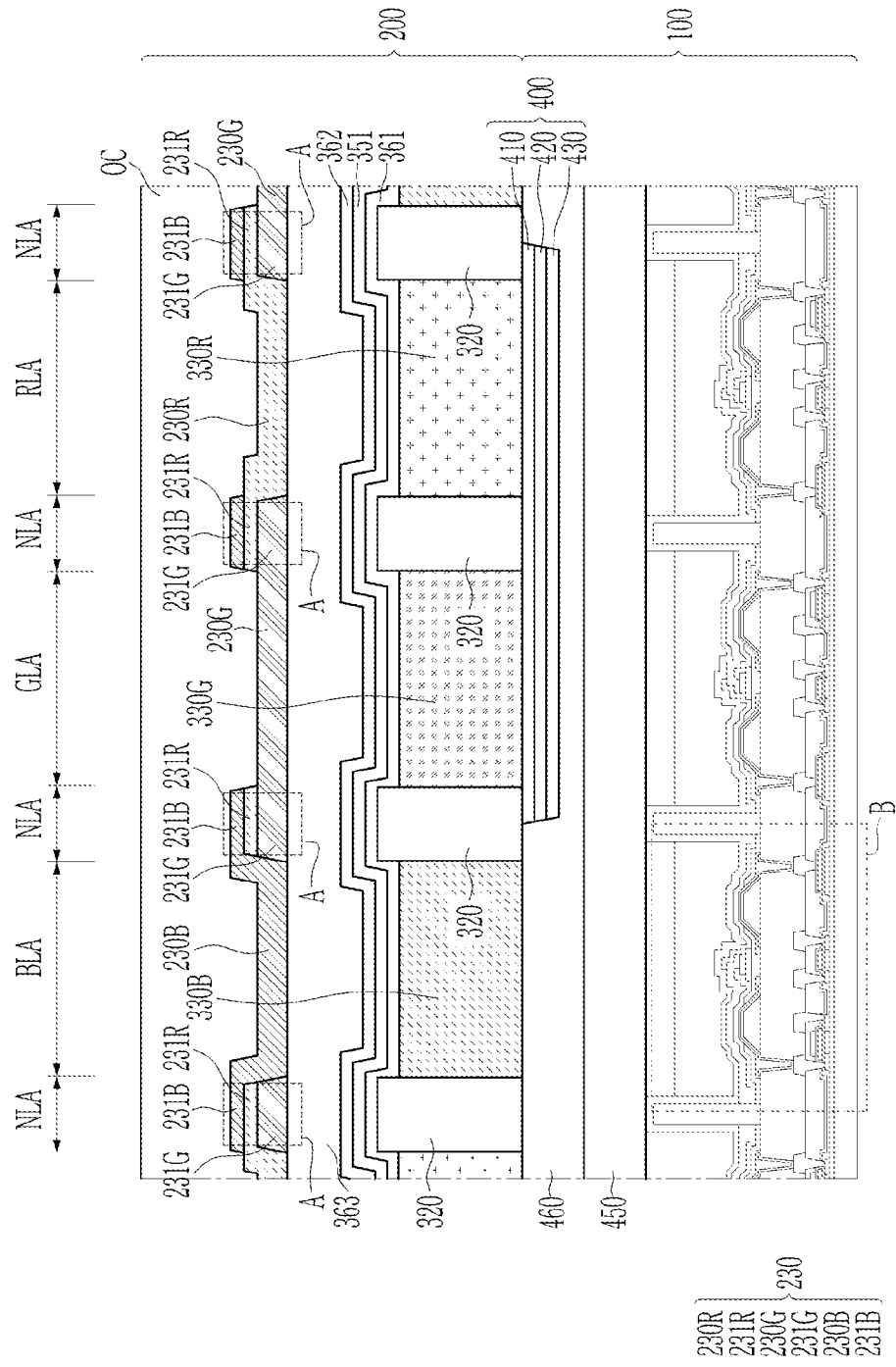
FIG. 22 is a cross-section of a display device according to an alternative embodiment.
Figure 23:
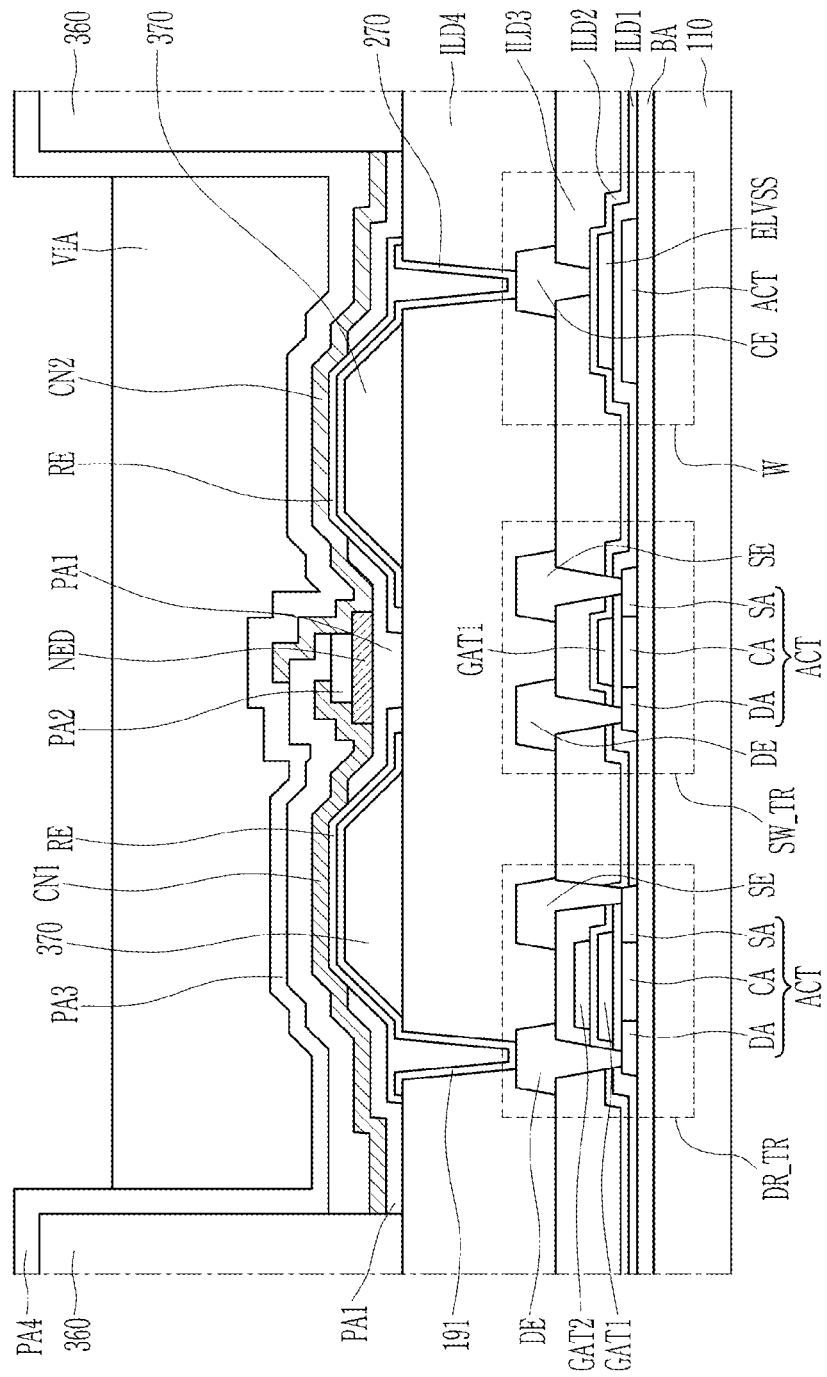
FIG. 23 is an enlarged view of the portion B in FIG. 22.

FIG. 22 is a cross-section of a display device according to an alternative embodiment. FIG. 23 is an enlarged view of the portion B in FIG. 22. Referring to FIG. 23, a barrier layer BA positioned on a first substrate 110 may be included in an embodiment. A semiconductor layer ACT may be positioned on the barrier layer BA. The semiconductor layer ACT may include a source area SA, a drain area DA, and a channel area CA. As shown in FIG. 23, the semiconductor layer ACT may form a driving transistor DR_TR and a switching transistor SW_TR. In addition, as shown in FIG. 23, the semiconductor layer ACT may be further positioned in a wiring area W.

A first interlayer insulating layer ILD1 may be positioned on the semiconductor layer ACT. A first gate electrode GAT1 may be positioned on the first interlayer insulating layer ILD1. The first gate electrode GAT1 may be positioned while overlapping a channel area CA of the semiconductor layer ACT that forms the driving transistor DR_TR and the switching transistor SW_TR. In FIG. 23, the first interlayer insulating layer ILD1 is entirely or commonly positioned on the first substrate 110, but not being limited thereto. Alternatively, the first interlayer insulating layer ILD1 may be positioned only between the semiconductor layer ACT and the gate electrode GAT.

A voltage line ELVSS may be positioned in or directly on a same layer as the first gate electrode GAT1.

The second interlayer insulating layer ILD2 may be positioned on the first gate electrode GAT1. As shown in FIG. 23, a second gate electrode GAT2 may be positioned on the second interlayer insulating layer ILD2. As shown in FIG. 23, the driving transistor may have a dual gate structure including the first gate electrode GAT1 and the second gate electrode GAT2. However, this is only an embodiment, and the invention is not limited thereto. In an alternative embodiment, the second gate electrode GAT2 may be omitted.

Referring to FIG. 23, a third interlayer insulating layer ILD3 is positioned on the second gate electrode GAT2. A source electrode SE and a drain electrode DE may be positioned on the third interlayer insulating layer ILD3. The source electrode SE and the drain electrode DE may contact the source area SA and the drain area DA of the semiconductor layer ACT through an opening defined or formed in the third interlayer insulating layer ILD3, respectively. In addition, the connection electrode CE may be positioned in or directly on a same layer as the source electrode SE and the drain electrode DE. The connection electrode CE may be connected to the voltage line ELVSS through an opening defined or formed in the third interlayer insulating layer ILD3.

A fourth interlayer insulating layer ILD4 is positioned on the source electrode SE, the drain electrode DE, and the connection electrode CE.

A first electrode 191 and a second electrode 270 are positioned on the fourth interlayer insulating layer ILD4. The first electrode 191 may contact the drain electrode DE of the driving transistor DR_TR through an opening defined or formed in the fourth interlayer insulating layer ILD4. The second electrode 270 may contact the connection electrode CE through the opening defined or formed in the fourth interlayer insulating layer ILD4 and may receive a common voltage.

A reflective wall 370 may be positioned on the fourth interlayer insulating layer ILD4. The reflective wall 370 includes an inclined surface, and as will be described later, the inclined surface for reflecting light emitted from a nano light emitting diode NED may be provided.

The first electrode 191 and the second electrode 270 are positioned to overlap the reflective wall 370 and may also be positioned to overlap the inclined surface of the reflective wall 370.

As shown in FIG. 23, a reflecting electrode RE positioned on each of the first electrode 191 and the second electrode 270 may be included. The reflecting electrode RE may form a reflective surface. The reflecting electrodes RE may be in contact with the first electrode 191 and the second electrode 270, respectively.

In an embodiment, a first passivation layer PA1 may be positioned on the reflecting electrode RE. The first passivation layer PA1 does not overlap a part of the reflecting electrode RE. That is, some regions of the reflecting electrode RE are not covered with the first passivation layer PA1.

The first passivation layer PA1 is also positioned between a spaced region of the reflective walls 370, and the nano light emitting diode NED is positioned on the first passivation layer PA1. The nano light emitting diode NED may include a nano rod. The nano light emitting diode NED may emit blue light, but is not limited thereto.

A first connecting member CN1 and a second connecting member CN2 may be positioned on the first passivation layer PA1. The first connecting member CN1 may be electrically connected to the first electrode 191, and the second connecting member CN2 may be electrically connected to the second electrode 270. The first connecting member CN1 and the second connecting member CN2 are respectively connected to the nano light emitting diode NED to transmit a voltage for light emitting of the nano light emitting diode NED.

A second passivation layer PA2 may be positioned on the nano light emitting diode NED. The second passivation layer PA2 may prevent the first connecting member CN1 and the second connecting member CN2 from contacting each other. In such an embodiment, the third passivation layer PA3 is positioned on the first connecting member CN1, and thus the first connecting member CN1 and the second connecting member CN2 do not contact each other.

A partitioning wall 360 may be positioned between the respective nano light emitting diodes NED. A fourth passivation layer PA4 is positioned on the partitioning wall 360 to protect the device from the external environment.

As shown in FIG. 23, a space between the partitioning walls 360 may be filled with an organic layer VIA.

Referring back to FIG. 22, the bank 320 is the same as that described above. Any repetitive detailed description of the same constituent elements as those described above will be omitted. In such an embodiment, the banks 320 may be positioned to be spaced apart from each other with a plurality of openings therebetween, and each opening may overlap each of the color filters 230R, 230G, and 230B in a direction that is perpendicular to the surface of the first substrate 110.

A red color conversion layer 330R, a green color conversion layer 330G, and a transmission layer 330B are positioned in a region between the banks 320 spaced apart from each other. In an embodiment, as shown in FIG. 23, the red color conversion layer 330R is positioned in a region overlapping a red light emitting area RLA. The red color conversion layer 330R may convert the incident light into red. The red color conversion layer 330R may include quantum dots. In such an embodiment, as shown in FIG. 23, the green color conversion layer 330G is positioned in a region overlapping a green light emitting area GLA. The green color conversion layer 330G may convert the incident light into green. The green color conversion layer 330G may include quantum dots.

Referring to FIG. 23, a color conversion layer is not positioned in a portion corresponding to the blue light emitting area BLA among spaces partitioned by the banks 320. In such an embodiment, the transmission layer 330B may be positioned. The transmission layer 330B may include a scatterer. The scatterer may include at least one selected from $SiO_2$, $BaSO_4$, $Al_2O_3$, ZnO, $ZrO_2$, and $TiO_2$. The bank 320 may include a polymer resin and a scatterer included in the polymer resin. In an embodiment, for example, the transmission layer 330B may include $TiO_2$, but this is not restrictive. The transmission layer 330B may transmit light incident from the display panel.

A first capping layer 361 may be positioned on the color conversion layer and the transmission layer. A low refractive layer 351 may be positioned on the first capping layer 361

The low refractive layer 351 may have a refractive index of about 1.2 or less. The low refractive layer 351 may include a mixture of organic and inorganic materials.

A second capping layer 362 may be positioned on the low refractive layer 351. A planarization layer 363 may be positioned on the second capping layer 362. The planarization layer 363 may be an organic layer, and an upper portion thereof may be planarized to form a color filter thereon.

The color filter 230 is positioned on the planarization layer 363. The color filter 230 may include a blue color filter 230G and a blue dummy color filter 231G, and a red color filter 230R and a red dummy color filter 231R on a blue color filter 230B and a blue dummy color filter 231B. In such an embodiment, the blue color filter 230G and the blue dummy color filter 231G, and the red color filter 230R and the red dummy color filter 231R on the blue color filter 230B and the blue dummy color filter 231B is the same as those of FIG. 1, and therefore any repetitive detailed description thereof will be omitted.

An overcoat OC may be positioned on the color filter 230. The overcoat OC may include a material with high hardness.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A color conversion panel comprising:
    a substrate;
    a plurality of banks disposed on the substrate, wherein the banks partition a first light emitting region, a second light emitting region, and a third light emitting region;
    a first color conversion layer disposed in the first light emitting region, a second color conversion layer disposed in the second light emitting region, and a transmission layer disposed in the third light emitting region; and
    a first reflective layer disposed to overlap the first color conversion layer and the second color conversion layer,
    wherein the first reflective layer comprises a first layer, a second layer, and a third layer,
    a refractive index of the second layer of the first reflective layer is greater than a refractive index of the third layer of the first reflective layer, and
    the refractive index of the third layer of the first reflective layer is greater than a refractive index of the first layer of the first reflective layer.

2. The color conversion panel of claim 1, wherein
    the first layer of the first reflective layer is closest to the substrate,
    the third layer of the first reflective layer is furthest from the substrate, and
    the second layer of the first reflective layer is between the first layer of the first reflective layer and the third layer of the first reflective layer.

3. The color conversion panel of claim 1, wherein
    a thickness of the second layer of the first reflective layer is less than a thickness of the first layer of the first reflective layer and a thickness of the third layer of the first reflective layer.

4. The color conversion panel of claim 1, wherein
    a thickness of the first layer of the first reflective layer is in a range of about 120 nm to about 140 nm,
    a thickness of the second layer of the first reflective layer is in a range of about 90 nm to about 110 nm, and
    a thickness of the third layer of the first reflective layer is in a range of about 120 nm to about 140 nm.

5. The color conversion panel of claim 4, wherein
    the refractive index of the first layer of the first reflective layer is in a range of about 1.35 to about 1.45.

6. The color conversion panel of claim 5, wherein
    the refractive index of the second layer of the first reflective layer is in a range of about 1.92 to about 2.02.

7. The color conversion panel of claim 6, wherein
    the refractive index of the third layer of the first reflective layer is in a range of about 1.55 to about 1.65.

8. The color conversion panel of claim 7, wherein
the first reflective layer has a reflectance less than about 1% for light of a wavelength of about 450 nm and a reflectance greater than about 6% for light of a wavelength in a range of about 550 nm to 650 nm.

9. The color conversion panel of claim 1, wherein
the first light emitting region emits red light,
the second light emitting region emits green light, and
the third light emitting region emits blue light.

10. A display device comprising:
a color conversion panel; and
a display panel disposed to overlap the color conversion panel,
wherein the display panel comprises:
  a first substrate; and
  a light emitting element disposed on the first substrate,
wherein the color conversion panel comprises:
  a second substrate;
  a plurality of banks disposed on the second substrate, wherein the banks partition a first light emitting region, a second light emitting region, and a third light emitting region;
  a first color conversion layer disposed in the first light emitting region, a second color conversion layer disposed in the second light emitting region, and a transmission layer disposed in the third light emitting region; and
  a first reflective layer disposed to overlap the first color conversion layer and the second color conversion layer,
wherein the first reflective layer comprises a first layer, a second layer, and a third layer,
a refractive index of the second layer of the first reflective layer is greater than a refractive index of the third layer of the first reflective layer, and
the refractive index of the third layer of the first reflective layer is greater than a refractive index of the first layer of the first reflective layer.

11. The display device of claim 10, wherein
the third layer of the first reflective layer is closest to the light emitting element,
the first layer of the first reflective layer is furthest from the light emitting element, and
the second layer of the first reflective layer is between the first layer of the first reflective layer and the third layer of the first reflective layer.

12. The display device of claim 11, wherein
a thickness of the first layer of the first reflective layer is in a range of about 120 nm to about 140 nm,
a thickness of the second layer of the first reflective layer is in a range of about 90 nm to about 110 nm, and
a thickness of the third layer of the first reflective layer is in a range of about 120 nm to about 140 nm.

13. The display device of claim 12, wherein
the refractive index of the first layer of the first reflective layer is in a range of about 1.35 to about 1.45,
the refractive index of the second layer of the first reflective layer is in a range of about 1.92 to about 2.02, and
the refractive index of the third layer of the first reflective layer is in a range of about 1.55 to about 1.65.

14. The display device of claim 13, wherein
the first reflective layer has a reflectance less than about 1% for light of a wavelength of about 450 nm and a reflectance greater than about 6% for light of a wavelength in a range of about 550 nm to about 650 nm.

15. The display device of claim 10, wherein
the first light emitting region emits red light,
the second light emitting region emits green light, and
the third light emitting region emits blue light.

16. The display device of claim 10, wherein
the light emitting element includes an organic emission layer or a nano rod emission layer.

* * * * *